United States Patent
Yang et al.

(10) Patent No.: US 11,508,306 B2
(45) Date of Patent: Nov. 22, 2022

(54) DISPLAY APPARATUS COMPRISING DIFFERENT TYPES OF THIN FILM TRANSISTORS AND METHOD FOR MANUFACTURING THE SAME

(71) Applicant: LG Display Co., Ltd., Seoul (KR)

(72) Inventors: JeongSuk Yang, Paju-si (KR); YongSeok Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 26 days.

(21) Appl. No.: 17/119,265

(22) Filed: Dec. 11, 2020

(65) Prior Publication Data

US 2021/0193045 A1 Jun. 24, 2021

(30) Foreign Application Priority Data

Dec. 24, 2019 (KR) .................. 10-2019-0173930

(51) Int. Cl.
| | |
|---|---|
| *G09G 3/3258* | (2016.01) |
| *H01L 27/32* | (2006.01) |
| *H01L 51/56* | (2006.01) |
| *H01L 29/786* | (2006.01) |

(52) U.S. Cl.
CPC ....... *G09G 3/3258* (2013.01); *H01L 27/3244* (2013.01); *H01L 29/7869* (2013.01); *H01L 51/56* (2013.01)

(58) Field of Classification Search
CPC .............. G09G 3/3258; H01L 27/3244; H01L 29/7869; H01L 51/56

USPC .......... 345/204; 438/149, 164; 257/E27.111, 257/E29.296

See application file for complete search history.

(56) References Cited

U.S. PATENT DOCUMENTS

| | | | | |
|---|---|---|---|---|
| 2001/0030322 | A1* | 10/2001 | Yamazaki | G02F 1/133514 438/149 |
| 2006/0003505 | A1* | 1/2006 | Hwang | H01L 27/127 438/164 |
| 2008/0116457 | A1* | 5/2008 | Park | H01L 29/78696 257/E27.111 |
| 2013/0200361 | A1* | 8/2013 | Tsang | H01L 29/78696 257/E29.296 |
| 2015/0333089 | A1* | 11/2015 | Yamazaki | G11C 19/28 257/43 |
| 2018/0006102 | A1* | 1/2018 | Oh | G09G 3/3233 |
| 2020/0091264 | A1* | 3/2020 | Lee | H01L 27/3272 |
| 2020/0212077 | A1* | 7/2020 | Jang | H01L 27/3262 |
| 2021/0036029 | A1* | 2/2021 | Park | H01L 27/1225 |

FOREIGN PATENT DOCUMENTS

KR 10-2015-0101396 A 9/2015

\* cited by examiner

*Primary Examiner* — Prabodh M Dharia
(74) *Attorney, Agent, or Firm* — Birch, Stewart, Kolasch & Birch, LLP

(57) ABSTRACT

A display apparatus can include a first thin film transistor and a second thin film transistor, the first thin film transistor has a bottom gate structure, the second thin film transistor has a top gate structure, and an s-factor value of the first thin film transistor is smaller than an s-factor value of the second thin film transistor.

20 Claims, 22 Drawing Sheets

DISPLAY APPARATUS COMPRISING DIFFERENT TYPES OF THIN FILM TRANSISTORS AND METHOD FOR MANUFACTURING THE SAME

CROSS-REFERENCE TO RELATED APPLICATIONS

This application claims the priority benefit of the Korean Patent Application No. 10-2019-0173930 filed on Dec. 24, 2019 in the Republic of Korea, the entire contents of which are hereby expressly incorporated by reference as if fully set forth herein into the present application.

BACKGROUND

Field of the Invention

The present disclosure relates to a display apparatus comprising different types of thin film transistors and a method for manufacturing the same. In more detail, the present disclosure relates to a display apparatus comprising a bottom gate type thin film transistor and a top gate type thin film transistor and a method for manufacturing the same.

Discussion of the Related Art

A thin film transistor can be manufactured on a glass substrate or a plastic substrate, whereby the thin film transistor is widely used as a switching device or a driving device in a display apparatus such as a liquid crystal display apparatus or an organic light emitting display apparatus.

According to a material used for an active layer, the thin film transistor can be largely categorized into an amorphous silicon thin film transistor having an active layer of amorphous silicon, a polycrystalline silicon thin film transistor having an active layer of polycrystalline silicon, and an oxide semiconductor thin film transistor having an active layer of oxide semiconductor.

The oxide semiconductor thin film transistor (Oxide semiconductor TFT), which has high mobility and has a large resistance change in accordance with an oxygen content, is advantageous in that it facilitates to obtain desired properties. Also, an active layer of oxide is formed at a relatively low temperature for a process of manufacturing the oxide semiconductor thin film transistor, whereby it is possible to lower a manufacturing cost. Also, owing to the properties of oxide, an oxide semiconductor is transparent, whereby it is favorable to realization of a transparent display apparatus.

Generally, the display apparatus includes a plurality of thin film transistors which respectively provide different functions. For example, the properties required for the thin film transistor which serves as the switching device of the display apparatus may not be identical to the properties required for the thin film transistor which serves as the driving device. Also, according to a trend of high performance and high resolution in the display apparatus, it requires a high-density integration of the thin film transistors in the display apparatus. Thus, for the high performance and high resolution of the display apparatus, it is necessary to effectively dispose the plurality of thin film transistors having the different properties in the display apparatus.

SUMMARY

The present disclosure has been made in view of the above problems and other limitations associated with the related art, and it is an object of the present disclosure to provide a display apparatus which facilitates to improve efficiency by a bottom gate type thin film transistor and a top gate type thin film transistor having the different properties disposed therein.

It is another object of the present disclosure to provide a display apparatus in which a bottom gate type thin film transistor and a top gate type thin film transistor, to which an oxide semiconductor is applied to an active layer, are used as a switching transistor or a driving transistor.

It is a further object of the present disclosure to provide a display apparatus comprising a plurality of thin film transistors which have the different s-factor values, and thus, have the different driving properties.

In accordance with an aspect of the present disclosure, the above and other objects can be accomplished by the provision of a display apparatus comprising a pixel driving circuit on a substrate, and a display device connected with the pixel driving circuit, wherein the pixel driving circuit includes a first thin film transistor and a second thin film transistor, wherein the first thin film transistor includes a first gate electrode on the substrate, and a first active layer which is spaced apart from the first gate electrode and overlaps with at least a portion of the first gate electrode, and wherein the second thin film transistor includes a second active layer on the substrate, and a second gate electrode which is spaced apart from the second active layer and overlaps with at least a portion of the second active layer, wherein each of the first active layer and the second active layer includes an oxide semiconductor material, respectively, and an s-factor value of the first thin film transistor is smaller than an s-factor value of the second thin film transistor.

The first active layer includes a first oxide semiconductor layer, and a second oxide semiconductor layer on the first oxide semiconductor layer.

The first thin film transistor further includes an upper gate electrode on the first active layer.

The first gate electrode is disposed between the substrate and the first active layer, and the second active layer is disposed between the substrate and the second gate electrode.

The first active layer and the second active layer are disposed on the same layer.

The first active layer and the second active layer are disposed on the different layers from each other.

The first thin film transistor is a switching transistor, and the second thin film transistor is a driving transistor.

In accordance with another aspect of the present disclosure, there is provided a method for manufacturing a display apparatus comprising a pixel driving circuit on a substrate, and a display device connected with the pixel driving circuit, wherein the pixel driving circuit includes a first thin film transistor and a second thin film transistor, wherein the first thin film transistor includes a first gate electrode on the substrate, and a first active layer on the first gate electrode, and the second thin film transistor includes a second active layer on the substrate, and a second gate electrode on the second active layer, wherein each of the first active layer and the second active layer includes an oxide semiconductor material, respectively, and an s-factor value of the first thin film transistor is larger than an s-factor value of the second thin film transistor.

The second active layer includes a first oxide semiconductor layer, and a second oxide semiconductor layer on the first oxide semiconductor layer.

The first active layer and the second active layer are disposed on the different layers from each other.

In accordance with a further aspect of the present disclosure, there is provided a method for manufacturing a display apparatus comprising providing a first gate electrode on a substrate, providing a first active layer which is spaced apart from the first gate electrode and overlaps with at least a portion of the first gate electrode, providing a second active layer which is spaced apart from the first active layer on the substrate, providing a first source electrode and a first drain electrode which are spaced apart from each other and are respectively connected with the first active layer, providing a second gate electrode which is spaced apart from the second active layer and overlaps with at least a portion of the second active layer, and selectively providing conductivity to the second active layer, wherein the first active layer and the second active layer are formed of an oxide semiconductor material.

At least one of the first active layer and the second active layer includes a first oxide semiconductor layer, and a second oxide semiconductor layer on the first oxide semiconductor layer.

Providing the first active layer and providing the second active layer can be carried out at the same time.

Providing the first active layer and providing the second active layer can include a pattering process using a halftone mask.

The method can further include providing a first connection electrode and a second connection electrode on the substrate.

BRIEF DESCRIPTION OF THE DRAWINGS

The above and other objects, features and other advantages of the present disclosure will be more clearly understood from the following detailed description taken in conjunction with the accompanying drawings. In the drawings.

DETAILED DESCRIPTION OF THE DISCLOSURE

Figure 1:
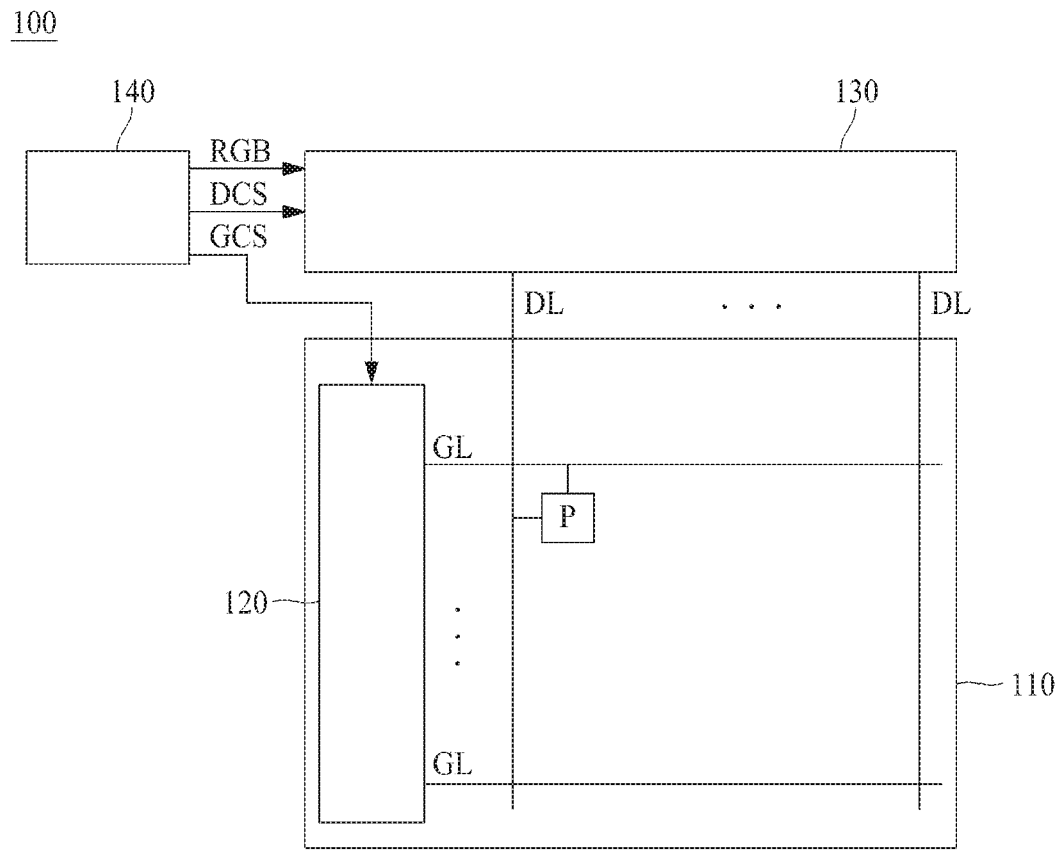
FIG. 1 is a schematic view illustrating a display apparatus according to one embodiment of the present disclosure.

Advantages and features of the present disclosure, and implementation methods thereof will be clarified through the following embodiments, described with reference to the accompanying drawings. The present disclosure can, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part can also be present unless "only" is used. The terms in a singular form can include plural forms unless noted to the contrary.

In construing an element, the element is construed as including an error region although there is no explicit description thereof.

In describing a positional relationship, for example, when the positional order is described as "on," "above," "below," "beneath", and "next," the case of no contact therebetween can be included, unless "just" or "direct" is used.

If it is mentioned that a first element is positioned "on" a second element, it does not mean that the first element is essentially positioned above the second element in the figure. The upper part and the lower part of an object concerned can be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous can be included, unless "just" or "direct" is used.

It will be understood that, although the terms "first," "second," etc. can be used herein to describe various elements, these elements should not be limited by these terms and may not define order. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" can include all combinations of two or more elements selected from the first, second and third elements as well as each element of the first, second and third elements.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in a co-dependent relationship.

In the drawings, the same or similar elements are denoted by the same reference numerals even though they are depicted in different drawings.

In the embodiments of the present disclosure, a source electrode and a drain electrode are distinguished from each other, for convenience of explanation. However, the source electrode and the drain electrode are used interchangeably. Thus, the source electrode can be the drain electrode, and the drain electrode can be the source electrode. Also, the source electrode in any one embodiment of the present disclosure can be the drain electrode in another embodiment of the present disclosure, and the drain electrode in any one embodiment of the present disclosure can be the source electrode in another embodiment of the present disclosure.

In one or more embodiments of the present disclosure, for convenience of explanation, a source region is distinguished from a source electrode, and a drain region is distinguished from a drain electrode. However, embodiments of the present disclosure are not limited to this structure. For example, a source region can be a source electrode, and a drain region can be a drain electrode. Also, a source region can be a drain electrode, and a drain region can be a source electrode.

FIG. 1 is a schematic view illustrating a display apparatus 100 according to one embodiment of the present disclosure. All components of the display apparatus according to all embodiments of the present disclosure are operatively coupled and configured.

As shown in FIG. 1, the display apparatus 100 according to one embodiment of the present disclosure includes a display panel 110, a gate driver 120, a data driver 130, and a controller 140.

The display panel 110 includes gate lines (GL) and data lines (DL), and a plurality of pixels (P) each disposed at an intersection of the corresponding gate line (GL) and the corresponding data line (DL). Each pixel (P) includes a display device 710, and a pixel driving circuit (PDC) configured to drive the display device 710. An image is displayed on the display panel 110 by driving the pixel (P).

The controller 140 controls the gate driver 120 and the data driver 130.

The controller 140 outputs a gate control signal (GCS) for controlling the gate driver 120, and a data control signal (DCS) for controlling the data driver 130 by the use of vertically/horizontally synchronized signal and clock signal supplied from an external system. Also, the controller 140 samples input video data, which is provided from the external system, and then re-aligns the sampled video data, and supplies the re-aligned video data (RGB) to the data driver 130.

The gate control signal (GCS) includes a gate start pulse (GSP), a gate shift clock (GSC), a gate output enable signal (GOE), a start signal (Vst), and a gate clock (GCLK). Also, control signals for controlling a shift register can be included in the gate control signal (GCS).

The data control signal (DCS) includes a source start pulse (SSP), a source shift clock signal (SSC), a source output enable signal (SOE), and a polarity control signal (POL).

The data driver 130 supplies a data voltage to the data lines (DL) of the display panel 110. In detail, the data driver 130 converts the video data (RGB) provided from the controller 140 into the data voltage, and supplies the data voltage to the data lines (DL).

The gate driver 120 sequentially supplies a gate pulse (GP) to the gate lines (GL) for 1 frame period. Herein, '1 frame' indicates the period in which an image is output through the use of display panel 110. Also, the gate driver 120 supplies a gate-off signal (Goff) for turning off a switching device to the gate line (GL) for the remaining period of 1 frame in which the gate pulse (GP) is not supplied. Hereinafter, the gate pulse (GP) and the gate-off signal (Goff) are totally referred to as a scan signal (SS).

According to one embodiment of the present disclosure, the gate driver 120 can be provided in the display panel 110. A structure of directly providing the gate driver 120 on the display panel 110 can be referred to as a Gate-In-Panel (GIP) structure.

Figure 2:
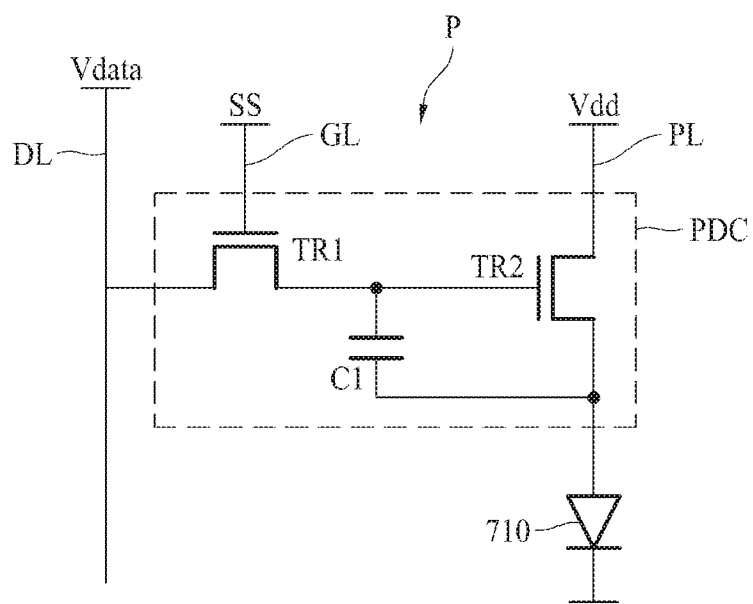
FIG. 2 is a circuit diagram for any one pixel of FIG. 1.
Figure 3:
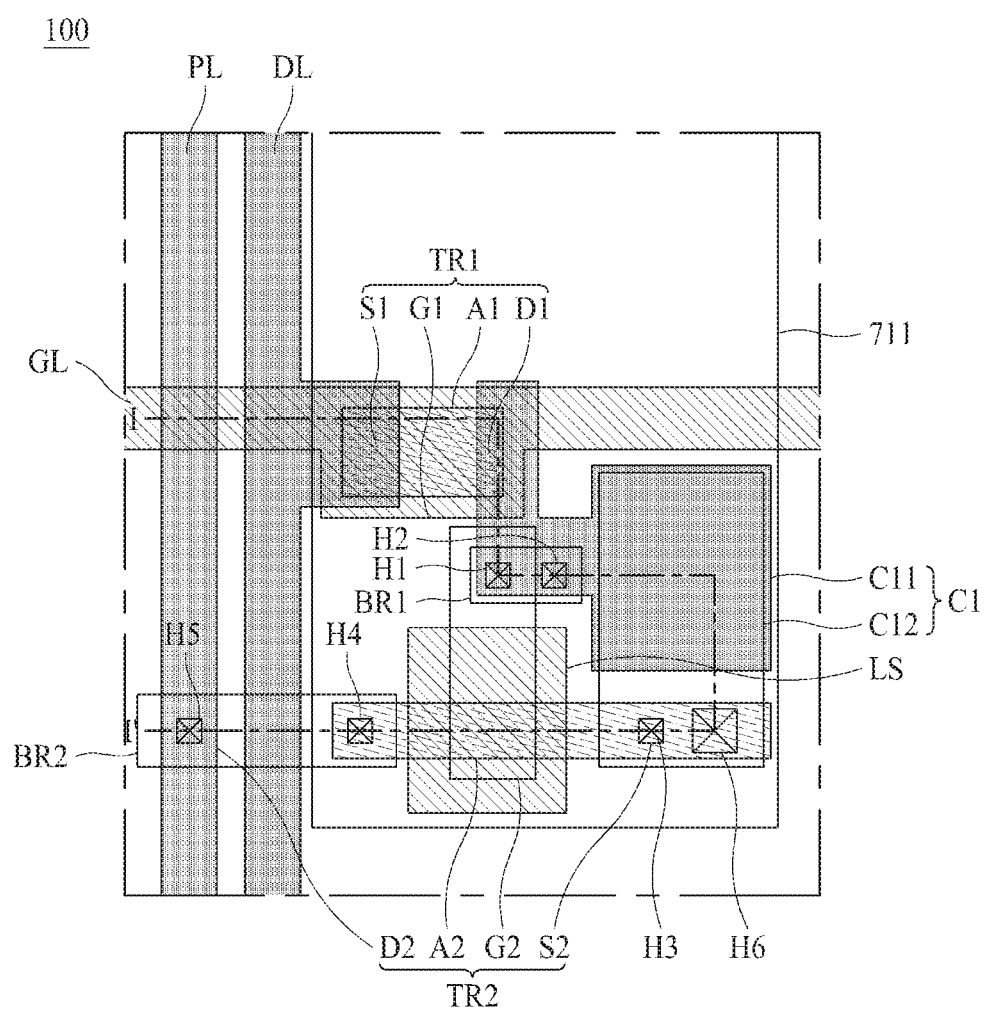
FIG. 3 is a plane view illustrating the pixel of FIG. 2.
Figure 4:
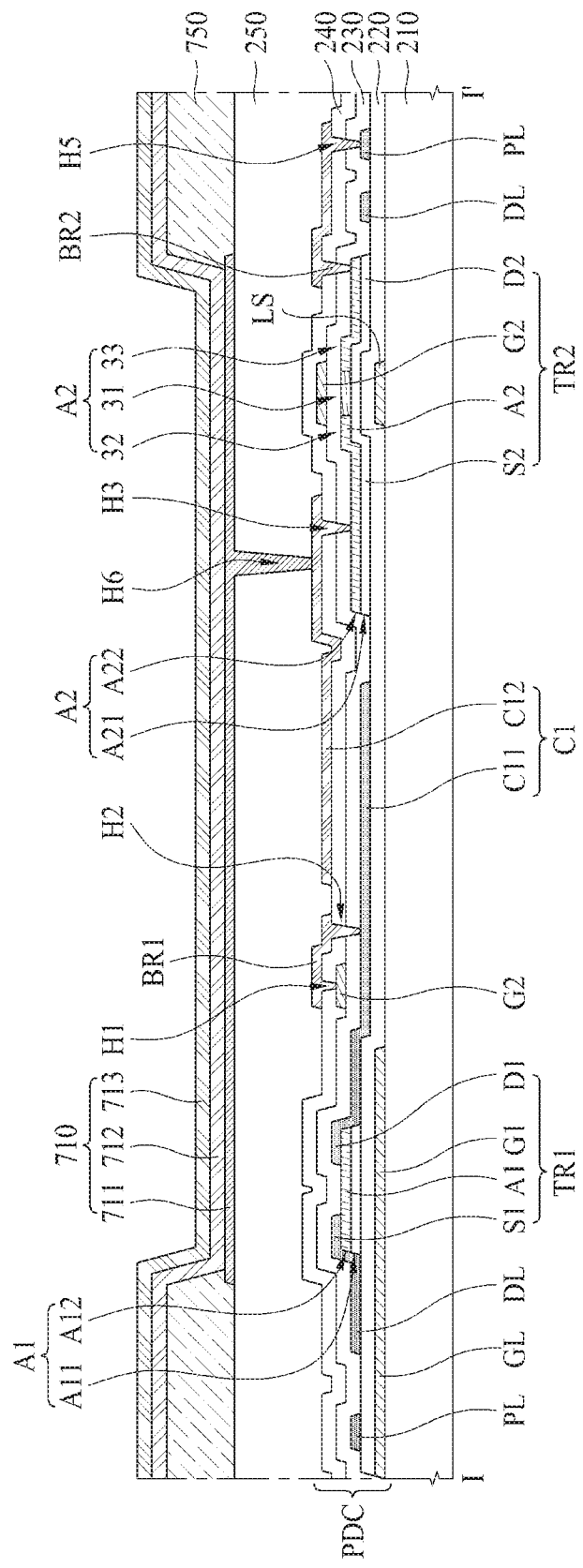
FIG. 4 is a cross sectional view along line I-I' of FIG. 3.

FIG. 2 is a circuit diagram for any one pixel (P) of FIG. 1, FIG. 3 is a plane view for the pixel (P) of FIG. 2, and FIG. 4 is a cross sectional view along line I-I' of FIG. 3.

Referring to FIGS. 2, 3, and 4, the display apparatus 100 according to one embodiment of the present disclosure includes a substrate 210, the pixel driving circuit (PDC) on the substrate 210, and the display device 710 connected with the pixel driving circuit (PDC). The pixel driving circuit (PDC) includes a first thin film transistor (TR1) and a second thin film transistor (TR2).

The circuit diagram of FIG. 2 corresponds to an equivalent circuit diagram for one pixel (P) in the display apparatus 100 comprising an organic light emitting diode (OLED) functioning as the emission device 710. Accordingly, the display apparatus 100 according to one embodiment of the present disclosure is an organic light emitting diode (OLED) display apparatus.

The pixel driving circuit (PDC) of FIG. 2 includes the first thin film transistor (TR1) corresponding to a switching transistor, and the second thin film transistor (TR2) corresponding to a driving transistor.

The first thin film transistor (TR1) is connected with the gate line (GL) and the data line (DL), and the first thin film transistor (TR1) is turned-on or turned-off by the scan signal (SS) supplied through the gate line (GL).

The data line (DL) provides the data voltage (Vdata) to the pixel driving circuit (PDC), and the first thin film transistor (TR1) controls applying the data voltage (Vdata).

A driving power line (PL) provides a driving voltage (Vdd) to the display device 710, and the second thin film transistor (TR2) controls the driving voltage (Vdd). Herein, the driving voltage (Vdd) is a pixel driving voltage for driving the organic light emitting diode (OLED) corresponding to the display device 710.

When the first thin film transistor (TR1) is turned-on, the data voltage (Vdata), which is supplied through the data line (DL), is supplied to a gate electrode (G2) of the second thin film transistor (TR2) connected with the emission device 710. The data voltage (Vdata) is charged in a first capacitor (C1) provided between a source electrode (S2) and the gate electrode (G2) of the second thin film transistor (TR2). The first capacitor (C1) corresponds to a storage capacitor (Cst).

An amount of current supplied to the organic light emitting diode (OLED) corresponding to the display device 710 through the second thin film transistor (TR2) is controlled in accordance with the data voltage (Vdd), whereby it is possible to control a grayscale of light emitted from the display device 710.

Referring to FIGS. 3 and 4, the first thin film transistor (TR1) includes a first gate electrode (G1) on the substrate 210, and a first active layer (A1) above the first gate electrode (G1). The first active layer (A1) is spaced apart from the first gate electrode (G1), and overlaps with at least a portion of the first gate electrode (G1).

The second thin film transistor (TR2) includes a second active layer (A2) above the substrate 210, and a second gate electrode (G2) above the second active layer (A2). The second gate electrode (G2) is spaced apart from the second active layer (A2), and overlaps with at least a portion of the second active layer (A2).

The substrate 210 can be formed of glass or plastic. The substrate 210 can be formed of plastic having flexibility, for example, polyimide (PI).

Referring to FIG. 4, the gate line (GL), the first gate electrode (G1), and a light shielding layer (LS) are disposed on the substrate 210. The first gate electrode (G1) can be the region extending from the gate line (GL), or can be some regions of the gate line (GL).

Referring to FIGS. 3 and 4, the first gate electrode (G1) extends from the gate line (GL), and the first gate electrode (G1) blocks ambient light which is incident on the first active layer (A1). Also, the light shielding layer (LS) blocks ambient light which is incident on the second active layer (A2). The light shielding layer (LS) can be formed of the same material as that of the first gate electrode (G1). The first gate electrode (G1) and the light shielding layer (LS) can be manufactured at the same time by the same process.

The first gate electrode (G1) can include at least one among aluminum-based metal such as aluminum or aluminum alloy, argentums-based metal such as argentums (Ag) or argentums alloy, copper-based metal such as copper (Cu) or copper alloy, molybdenum-based metal such as molybdenum or molybdenum alloy, chrome (Cr), tantalum (Ta), neodymium (Nd), and titanium (Ti). The first gate electrode (G1) can have a multi-layered structure including at least two layers with the different physical properties.

A first gate insulating film 220 is disposed on the first gate electrode (G1) and the light shielding layer (LS). The first gate insulating film 220 is formed of an insulating material, and the first gate insulating film 220 insulates the first gate electrode (G1) and the first active layer (A1) from each other. The first gate insulating film 220 can be formed of an insulating material, for example, silicon oxide or silicon nitride.

The first active layer (A1) is disposed on the first gate insulating film 220. At least a portion of the first active layer (A1) overlaps with the first gate electrode (G1).

Also, the second active layer (A2) is disposed on the first gate insulating film 220. The first gate insulating film 220 can be overlapped with the light shielding layer (LS).

Referring to FIG. 4, the first active layer (A1) and the second active layer (A2) can be disposed on the same layer. In this case, the first active layer (A1) and the second active layer (A2) can be patterned at the same time by the same process using the same material. However, one embodiment of the present disclosure is not limited to the above. The first active layer (A1) and the second active layer (A2) can be disposed on the different layers, and can be formed of the different materials.

According to one embodiment of the present disclosure, the first active layer (A1) and the second active layer (A2) can include an oxide semiconductor material. For example, the first active layer (A1) and the second active layer (A2) can include at least one among IZO(InZnO)-based oxide semiconductor, IGO(InGaO)-based oxide semiconductor, GO(GaO)-based oxide semiconductor, ITO(InSnO)-based oxide semiconductor, IGZO(InGaZnO)-based oxide semiconductor, IGTO(InGaSnO)-based oxide semiconductor, IGZTO(InGaZnSnO)-based oxide semiconductor, GZTO (GaZnSnO)-based oxide semiconductor, GZO(GaZnO)-based oxide semiconductor, and ITZO(InSnZnO)-based oxide semiconductor. However, one embodiment of the present disclosure is not limited to the above materials. The first active layers (A1) and the second active layer (A2) can be formed of other oxide semiconductor materials generally known to those in the art.

Referring to FIG. 4, the first active layer (A1) can have a multi-layered structure. The first active layer (A1) can include a first oxide semiconductor layer (A11), and a second oxide semiconductor layer (A12) on the first oxide semiconductor layer (A11).

Also, the second active layer (A2) can have a multi-layered structure. Referring to FIG. 4, the second active layer (A2) can include a first oxide semiconductor layer (A21), and a second oxide semiconductor layer (A22) on the first oxide semiconductor layer (A21).

According to one embodiment of the present disclosure, the first oxide semiconductor layer (A11, A21) functions as a main channel layer, and the second oxide semiconductor layer (A12, A22) functions as a protection layer for protecting the first oxide semiconductor layer (A11, A21) in addition to a channel layer. However, one embodiment of the present disclosure is not limited to the above. For instance, the second oxide semiconductor layer (A12, A22) can function as a main channel layer.

The first oxide semiconductor layer (A11, A21) can include at least one among IZO(InZnO)-based oxide semiconductor, IGO(InGaO)-based oxide semiconductor, ITO (InSnO)-based oxide semiconductor, IGZO(InGaZnO)-based oxide semiconductor, IGZTO(InGaZnSnO)-based oxide semiconductor, GZTO(GaZnSnO)-based oxide semiconductor, GZO(GaZnO)-based oxide semiconductor, and ITZO(InSnZnO)-based oxide semiconductor. However, one embodiment of the present disclosure is not limited to the above materials. The first oxide semiconductor layer (A11, A21) can be formed of other oxide semiconductor materials generally known to those in the art.

The second oxide semiconductor layer (A12, A22) can have a good film stability. According to one embodiment of the present disclosure, the second oxide semiconductor layer (A12, A22) can include at least one among IGZO(InGaZnO)-based oxide semiconductor material, IGO(InGaO)-based oxide semiconductor material, IGTO(InGaSnO)-based oxide semiconductor material, IGZTO(InGaZnSnO)-based oxide semiconductor material, GZTO(GaZnSnO)-based oxide semiconductor material, GO(GaO)-based oxide semiconductor material, and GZO(GaZnO)-based oxide semiconductor material. However, one embodiment of the present disclosure is not limited to the above materials. The second oxide semiconductor layer (A12, A22) can be formed of other oxide semiconductor materials generally known to those in the art.

The first oxide semiconductor layer (A11, A21) has the electrical properties which are greater than that of the second oxide semiconductor layer (A12, A22), and the second oxide semiconductor layer (A12, A22) can have the greater film stability in comparison to the first oxide semiconductor layer (A11, A21). By adjusting an etching ratio of the first oxide semiconductor layer (A11, A21) and the second oxide semiconductor layer (A12, A22), each of the first active layer (A1) and the second active layer (A2) can have a tapered shape.

A first source electrode (S1) and a first drain electrode (D1) are disposed on the at least some portions of the first active layer (A1). The first source electrode (S1) and the first drain electrode (D1) are spaced apart from each other, and are respectively connected with the first active layer (A1).

According to one embodiment of the present disclosure, the data line (DL) and the driving power line (PL) are disposed on the same layer as those of the first source electrode (S1) and the first drain electrode (D1). The data line (DL), the driving power line (PL), the first source electrode (S1), and the first drain electrode (D1) can be manufactured at the same time by the same process using the same material. The data line (DL) can be formed as one body with any one of the first source electrode (S1) and the first drain electrode (D1).

The first source electrode (S1), the first drain electrode (D1), the data line (DL), and the driving power line (PL) can include at least one among aluminum (Al), argentums (Ag), copper (Cu), molybdenum (Mo), chrome (Cr), tantalum (Ta), neodymium (Nd), and titanium (Ti). The first source electrode (S1), the first drain electrode (D1), the data line (DL), and the driving power line (PL) can be formed in a single-layered structure or a multi-layered structure.

Referring to FIGS. 3 and 4, the first drain electrode (D1) extends onto the first gate insulating film 220, whereby it can be a first capacitor electrode (C11). The first capacitor electrode (C11) can be disposed on the same layer as those of the first source electrode (S1) and the first drain electrode (D1), and can be formed of the same material as those of the first source electrode (S1) and the first drain electrode (D1). According to one embodiment of the present disclosure, a portion of the first drain electrode (D1) can be the first capacitor electrode (C11).

A second gate insulating film 230 is provided on the first source electrode (S1), the first drain electrode (D1), the first capacitor electrode (C11), the data line (DL), and the driving power line (PL). The second gate insulating film 230 has the insulating properties. Referring to FIG. 4, the second gate insulating film 230 is not patterned, but disposed on an entire upper surface of the substrate 210.

The second gate electrode (G2) is disposed on the second gate insulating film 230.

The second gate electrode (G2) is formed of the same material as that of the first gate electrode (G1), or can be formed of the different material from that of the first gate electrode (G1).

The second active layer (A2) can have a conducting region by a selective conductivity providing process using the second gate electrode (G2) as a mask. The conducting region can be a region of the active layer provided with the conductivity.

A region of the second active layer (A2), which overlaps with the second gate electrode (G2), is not provided with conductivity, and thus does not become a conducting region, but become a channel region 31. Some regions of the second active layer (A2), which do not overlap with the second gate electrode (G2), are provided with conductivity, and thus become conducting regions 32 and 33. Generally, the conducting regions 32 and 33 are formed at both sides with respect to the channel region 31.

According to one embodiment of the present disclosure, a region of the first active layers (A1) and a region of the second active layer (A2) can be provided with conductivity, selectively, by a doping process using dopant. In this case, a doped region is provided with conductivity, and thus becomes a conducting region. For the doping process, for example, at least one of boron (B) ion, phosphorous (P) ion, and fluorine (F) ion can be used.

In the selective conductivity providing process to the second active layer (A2) by the doping process using the dopant, the second active layer (A2) can be doped with the dopant through the second gate insulating film 230. Thus, even though the second active layer (A2) is not exposed from the second gate insulating film 230, the selective doping for the second active layer (A2) is possible. Thus, according to one embodiment of the present disclosure, it is possible not to pattern the second gate insulating film 230.

However, one embodiment of the present disclosure is not limited to the above. Herein, a region of the second active layer (A2) can be provided with conductivity by a dry etching process or a light irradiation process.

Any one of the conducting regions 32 and 33 becomes a source region 32, and the other becomes a drain region 33. The source region 32 serves as a source connection region connected with the source electrode (S2), or the source region 32 itself serves as the source electrode (S2). The drain region 33 serves as a drain connection region connected with the drain electrode (D2), or the drain region 33 itself serves as the drain electrode (D2).

The source region 32 and the drain region 33 shown in the drawings are distinguished from each other, for convenience of explanation. However, the source region 32 and the drain region 33 can be used interchangeably. According to a voltage, the source region 32 shown in the drawings can become the drain region 33, and the drain region 33 can become the source region 32. Also, the source region 32 can become the source electrode (S2) and the drain electrode (D2), and the drain region 33 can become the drain electrode (D2) and the source electrode (S2).

In case of this embodiment of the present disclosure, the source region 32 of the second active layer (A2) is referred to as the second source electrode (S2), and the drain region 33 is referred to as the second drain electrode (D2), for convenience of explanation.

A passivation layer 240 is disposed on the second gate electrode (G2). The passivation layer 240 protects the active layer (A1, A2) and the second gate electrode (G1, G2).

A first connection electrode (BR1), a second connection electrode (BR2), and a second capacitor electrode (C12) are disposed on the passivation layer 240. The first connection electrode (BR1), the second connection electrode (BR2), and the second capacitor electrode (C12) can be manufactured at the same time by the same process using the same material.

The first connection electrode (BR1) connects the first drain electrode (D1) and the second gate electrode (G2) with each other. For the connection between the first drain electrode (D1) and the second gate electrode (G2), a first contact hole (H1) is formed in the passivation layer 240, and a second contact hole (H2) is formed in the passivation layer 240 and the second gate insulating film 230. Referring to FIG. 4, the first connection electrode (BR1) is in contact with the first drain electrode (DL) via the first contact hole (H1), and the first connection electrode (BR1) is in contact with the second gate electrode (G2) via the second contact hole (H2). According as the first drain electrode (D1) and the second gate electrode (G2) are connected with each other through the use of first connection electrode (BR1), the data voltage (Vdata) can be applied to the second gate electrode (G2). Also, according as the first capacitor electrode (C11) is formed as one body with the first drain electrode (D1), the same voltage can be identically applied to the first capacitor (C11) and the second gate electrode (G2).

The second connection electrode (BR2) connects the driving power line (PL) and the second active layer (A2) with each other. For the connection between the driving power line (PL) and the second active layer (A2), a fourth contact hole (H4) and a fifth contact hole (H5) are provided. Referring to FIG. 4, the second connection electrode (BR2) is in contact with the drain region 33 of the second active layer (A2) via the fourth contact hole (H4), and the second connection electrode (BR2) is in contact with the driving power line (PL) via the fifth contact hole (H5). According to one embodiment of the present disclosure, the drain region 33 of the second active layer (A2) serves as the second drain electrode (D2). Thus, the driving voltage (Vdd), which is supplied from the driving power line (PL), is applied to the second thin film transistor (TR2) by the use of second connection electrode (BR2).

The second capacitor electrode (C12) is in contact with the source region 32 of the second active layer (A2) via a third contact hole (H3). According to one embodiment of the present disclosure, the source region 33 of the second active layer (A2) serves as the second source electrode (S2). Thus, the second capacitor electrode (C12) can be connected with the source electrode (S2) of the second thin film transistor (TR2). As a result, the first capacitor (C1) is formed by the first capacitor electrode (C11) and the second capacitor electrode (C12) which are overlapped with each other.

Referring to FIG. 4, a protection layer 250 is disposed on the first connection electrode (BR1), the second connection electrode (BR2), and the second capacitor electrode (C12). The protection layer 250 planarizes upper surfaces of the first thin film transistor (TR1) and the second thin film transistor (TR2), and protects the pixel driving circuit (PDC), whereby the protection layer 250 is referred to as a planarization layer.

The display device 710 is disposed on the protection layer 250. In detail, a first electrode 711, an emission layer 712, and a second electrode 713 are sequentially disposed on the protection layer 250, to thereby form the display device 710. The display device 710 is connected with the pixel driving circuit (PDC).

The first electrode 711 of the display device 710 is disposed on the protection layer 250. The first electrode 711 can be connected with the second thin film transistor (TR2) via a sixth contact hole (H6). The sixth contact hole (H6) can be formed in the protection layer 250. Referring to FIG. 4, the first electrode 711 is connected with the second capacitor electrode (C12) via the sixth contact hole (H6). In this case, according as the second capacitor electrode (C12) is connected with the source electrode (S2) of the second thin film transistor (TR2), the first electrode 711 can be connected with the second thin film transistor (TR2). As a result, the display device 710 can be connected with the pixel driving circuit (PDC).

A bank layer 750 is disposed on the periphery of the first electrode 711. The bank layer 750 defines an emission area of the display device 710.

The emission layer 712 is disposed on the first electrode 711. Herein, the emission layer 712 is an organic emission layer including an organic material. The second electrode 713 is disposed on the emission layer 712. Accordingly, it is possible to complete the display device 710.

The display device 710 shown in FIG. 4 corresponds to an organic light emitting diode (OLED). Thus, the display apparatus 100 according to one embodiment of the present disclosure corresponds to an organic light emitting diode (OLED) display apparatus.

According to one embodiment of the present disclosure, the first gate electrode (G1), the first active layer (A1), the first source electrode (S1), and the first drain electrode (D1) constitute the first thin film transistor (TR1).

Referring to FIG. 4, the first gate electrode (G1) is disposed between the substrate 210 and the first active layer (A1). As shown in FIG. 4, a structure of the first thin film transistor (TR1) in which the first gate electrode (G1) is disposed below the first active layer (A1) is referred to as a bottom gate structure. Typically, a channel of the first active layer (A1) can be provided in the first oxide semiconductor layer (A11).

For a manufacturing process of the first thin film transistor (TR1) having the bottom gate structure, a conductivity providing process to the first active layer (A1) is not carried out. Also, in case of the first active layer (A1) of the first thin film transistor (TR1), the first oxide semiconductor layer (A11) serving as the main channel layer is protected by the second oxide semiconductor layer (A12), whereby the first oxide semiconductor layer (A11) is not directly exposed to an etching process. Thus, for the manufacturing process of the first thin film transistor (TR1), it is possible to minimize damages on the first oxide semiconductor layer (A11) so that it is possible to maintain the good semiconductor properties of the first oxide semiconductor layer (A11). As a result, the switching properties of the first thin film transistor (TR1) is not lowered, whereby the first thin film transistor (TR1) can have a low s-factor.

As the first thin film transistor (TR1) according to one embodiment of the present disclosure has a deposition structure of the two oxide semiconductor layers, the first thin film transistor (TR1) has the low s-factor and the good switching properties, whereby the first thin film transistor (TR1) can be used as a switching transistor.

According to one embodiment of the present disclosure, the second gate electrode (G2), the second active layer (A2), the second source electrode (S2), and the second drain electrode (D2) constitute the second thin film transistor (TR2).

Referring to FIG. 4, the second active layer (A2) is disposed between the substrate 210 and the second gate electrode (G2). As shown in FIG. 4, the second thin film transistor (TR2) has a top gate structure where the second gate electrode (G2) is disposed above the second active layer (A2). Typically, a channel of the second active layer (A2) can be provided in the second oxide semiconductor layer (A22).

For a manufacturing process of the second thin film transistor (TR2), a conductivity providing process to the second active layer (A2) can be carried out. In this case, the channel region 31 can be damaged or contaminated by the conductivity providing process to the second active layer (A2). Also, in case of the second active layer (A2), the second oxide semiconductor layer (A22) serving as a main channel is disposed on the upper portion thereof so that the second oxide semiconductor layer (A22) can be directly exposed to etching and patterning processes. As a result, it can cause damage or contamination on the channel region 31 of the second active layer (A2), whereby the switching properties of the second thin film transistor (TR2) can be deteriorated, and an s-factor of the second thin film transistor (TR2) can be increased.

Accordingly, the s-factor of the second thin film transistor (TR2) can be relatively larger than the s-factor of the first thin film transistor (TR1). Thus, the second thin film transistor (TR2) can be used as a driving transistor.

According to one embodiment of the present disclosure, the first thin film transistor (TR1) having the relatively low s-factor value and the good switching properties is used as the switching transistor, and the second thin film transistor (TR2) having the relatively high s-factor value and the good grayscale expression is used as the driving transistor so that it is possible to improve a driving efficiency of the display apparatus 100.

Thus, according to one embodiment of the present disclosure, the thin film transistors (TR1, TR2) having the different structures and different properties can be used appropriately in accordance with the respective properties.

Figure 5:
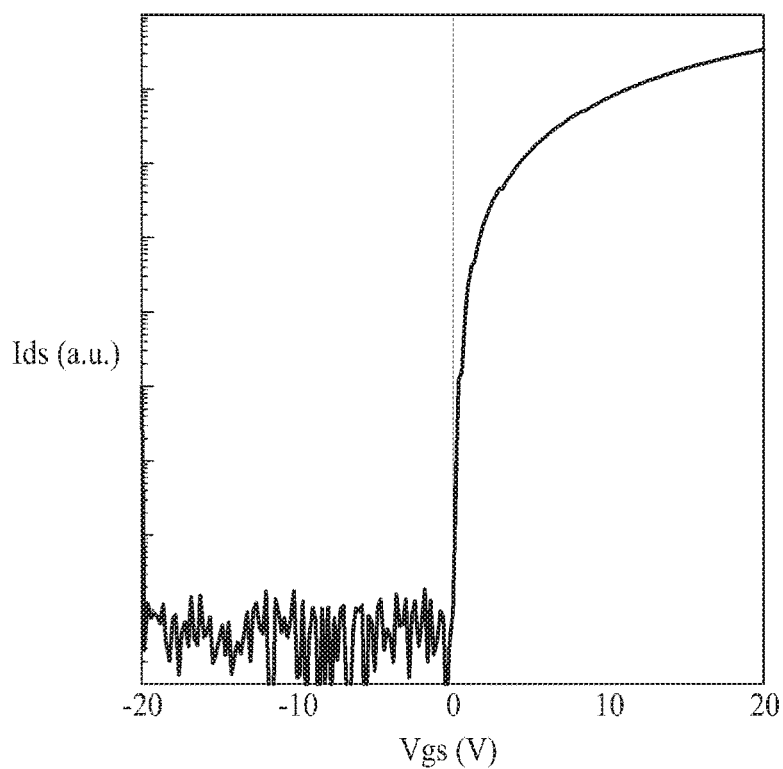
FIG. 5 is a graph for a threshold voltage to a first thin film transistor of FIG. 3.
Figure 6:
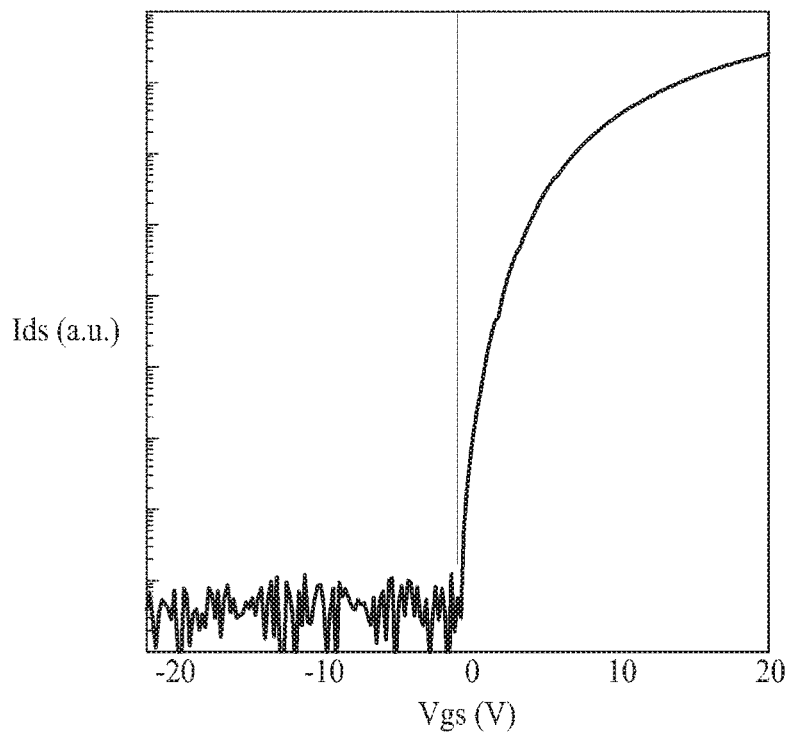
FIG. 6 is a graph for a threshold voltage to a second thin film transistor of FIG. 3.

FIG. 5 is a graph for a threshold voltage to the first thin film transistor (TR1) of FIG. 3, and FIG. 6 is a graph for a threshold voltage to the second thin film transistor (TR2) of FIG. 3.

The s-factor (sub-threshold swing: s-factor) of the thin film transistor is obtained by a reciprocal value of an inclination in a graph for a source-drain current (Ids) to a gate voltage (Vgs) in a threshold voltage (Vth) section of the thin film transistor. If the s-factor value is small, a variation of a drain-source current (Ids) to the gate voltage (Vgs) in the threshold voltage (Vth) section is large, whereby it can have the good switching properties.

Referring to FIG. 5, in case of the first thin film transistor (TR1) comprising the first oxide semiconductor layer (A11) which is protected by the second oxide semiconductor layer (A12) serving as the protection layer and has the good electrical properties, a variation of the source-drain current (Ids) to the gate voltage (Vgs) in the threshold voltage (Vth) section is large. Thus, the first thin film transistor (TR1) has the small s-factor value, and has the good switching properties.

Referring to FIG. 6, in case of the second thin film transistor (TR2), a variation of the source-drain current (Ids) to the gate voltage (Vgs) in the threshold voltage (Vth) section is relatively small. The second thin film transistor (TR2) has a relatively large s-factor value, and has a gentle variation of the drain-source current (Ids) to the gate voltage (Vgs) in the threshold voltage (Vth) section. Thus, it facilitates to adjust a level of the drain-source current (Ids) of the second thin film transistor (TR2) by adjusting a voltage applied to the second gate electrode (G2) of the second thin film transistor (TR2). The grayscale of the pixel can be controlled by adjusting the level of the drain-source current (Ids). For example, it facilitates to adjust the grayscale of the pixel owing to the easy adjustment on the level of the drain-source current (Ids). Thus, according to one embodiment of the present disclosure, if the second thin film transistor (TR2) is used as the driving thin film transistor, it facilitates a grayscale expression of the pixel.

Figure 7:
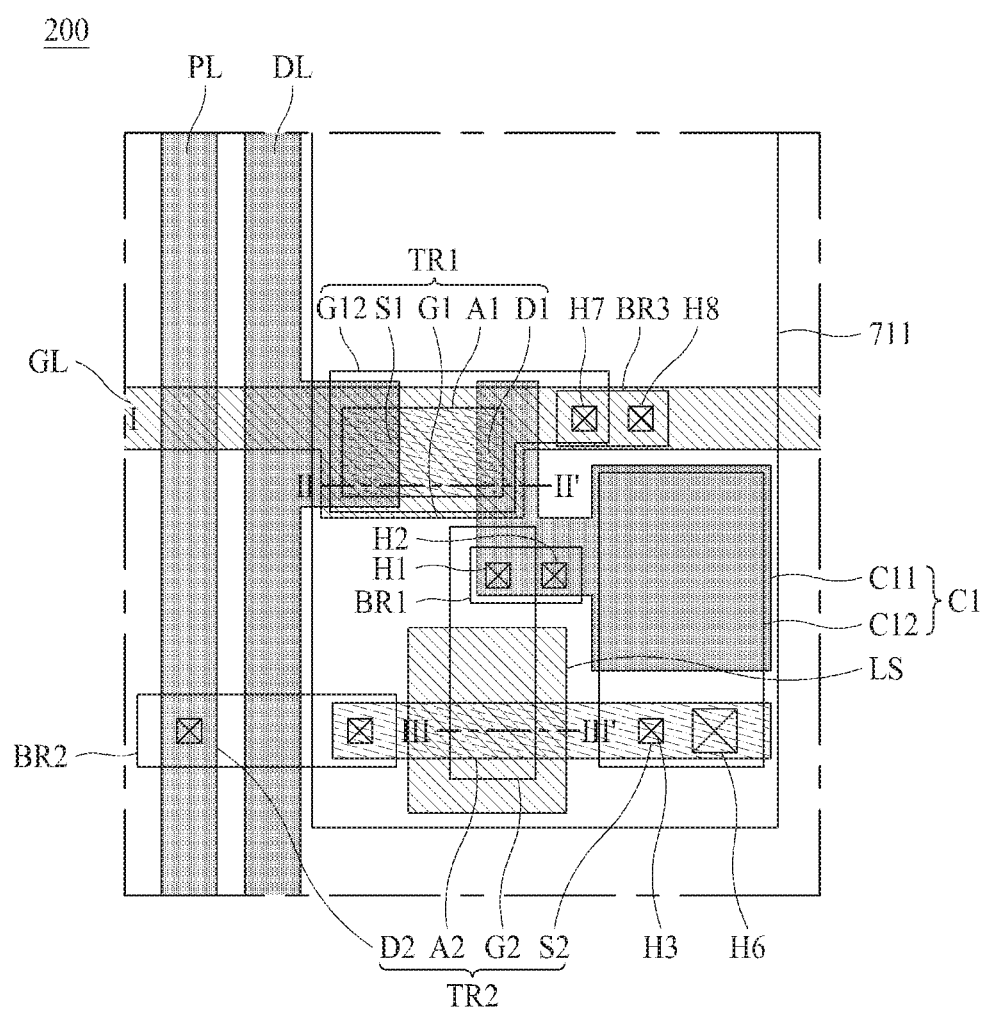
FIG. 7 is a plane view illustrating a pixel of a display apparatus according to another embodiment of the present disclosure.
Figure 8:
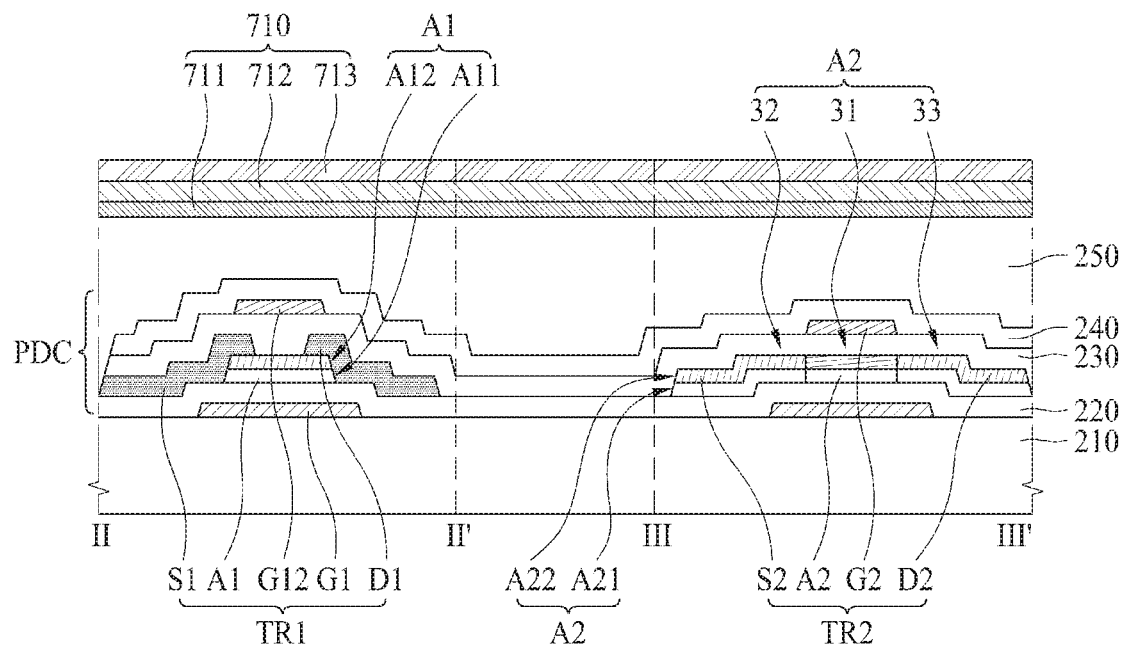
FIG. 8 is a cross sectional view along lines II-II' and III-III' of FIG. 7.

FIG. 7 is a plane view illustrating a pixel of a display apparatus 200 according to another embodiment of the present disclosure. FIG. 8 is a cross sectional view along lines II-II' and III-III' of FIG. 7.

Referring to FIGS. 7 and 8, a first thin film transistor (TR1) further includes an upper gate electrode (G12) on a first active layer (A1). The upper gate electrode (G12) can be disposed on the same layer as that of a second gate electrode (G2).

The upper gate electrode (G12) is connected with a gate line (GL) via a third connection electrode (BR3). Referring to FIG. 7, the third connection electrode (BR3) is in contact with the upper gate electrode (G12) via a seventh contact hole (H7), and is in contact with the gate line (GL) via an eighth contact hole (H8), whereby the third connection electrode (BR3) can connect the upper gate electrode (G12) with the gate line (GL).

According to one embodiment of the present disclosure, a conductivity providing process to the first active layer (A1) is not carried out, however, a selective conductivity providing process to a second active layer (A2) is carried out under the condition that the second gate electrode (G12) is used as a mask. The upper gate electrode (G12) is disposed on the first active layer (A1) so that it is possible to prevent the first active layer (A1) from being damaged by the selective conductivity providing process to the second active layer (A2). As a result, the first active layer (A1) is protected more safely, and an s-factor of the first thin film transistor (TR1) is maintained at a low value so that it is possible to provide the first thin film transistor (TR1) having the good switching properties.

In the embodiment shown in FIGS. 7 and 8, the first thin film transistor (TR1) is used as a switching transistor, and the second thin film transistor is used as a driving transistor.

Figure 9:
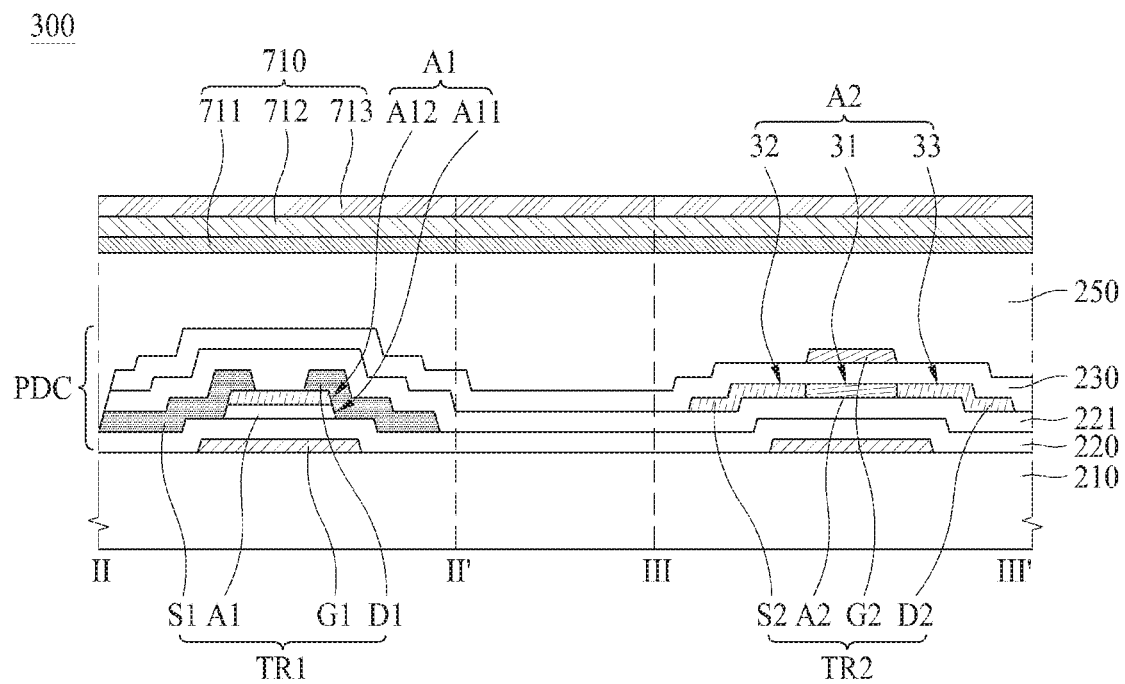
FIG. 9 is a cross sectional view illustrating thin film transistors of a display apparatus according to another embodiment of the present disclosure.

FIG. 9 is a cross sectional view illustrating thin film transistors (TR1, TR2) of a display apparatus 300 according to another embodiment of the present disclosure. Hereinafter, in order to avoid a repetitive description, a structure of the thin film transistors will be described with reference to the cross sectional views along lines II-II' and III-III' of FIG. 7.

Referring to FIG. 9, a second active layer (A2) has a single-layered structure, and an additional protection layer is not provided in the second active layer (A2). Thus, for a process of manufacturing the second thin film transistor (TR2), the second active layer (A2) is directly exposed to an etching process, whereby the second active layer (A2) can be contaminated. Accordingly, an s-factor of the second thin film transistor (TR2) is relatively larger than an s-factor of the first thin film transistor (TR1), whereby it can be favorable to a grayscale expression. In the display apparatus 300 according to another embodiment of the present disclosure, the second thin film transistor (TR2) is used as a driving transistor.

Also, referring to FIG. 9, an insulating interlayer 221 is disposed on a first source electrode (S1) and a first drain electrode (D1), and the second active layer (A2) is disposed on the insulating interlayer 221.

As shown in FIG. 9, according to another embodiment of the present disclosure, a first active layer (A1) can be disposed on the different layer from that of the second active layer (A2). According as the insulating interlayer 221 is disposed before forming the second active layer (A2), it is possible to efficiently protect the first active layer (A1).

The insulating interlayer 221 protects the first active layer (A1), and prevents the first active layer (A1) from being contaminated by a selective conductivity providing process to the second active layer (A2). As a result, the first thin film transistor (TR1) can have a low s-factor value, and the first thin film transistor (TR1) can be used as a switching transistor.

Figure 10:
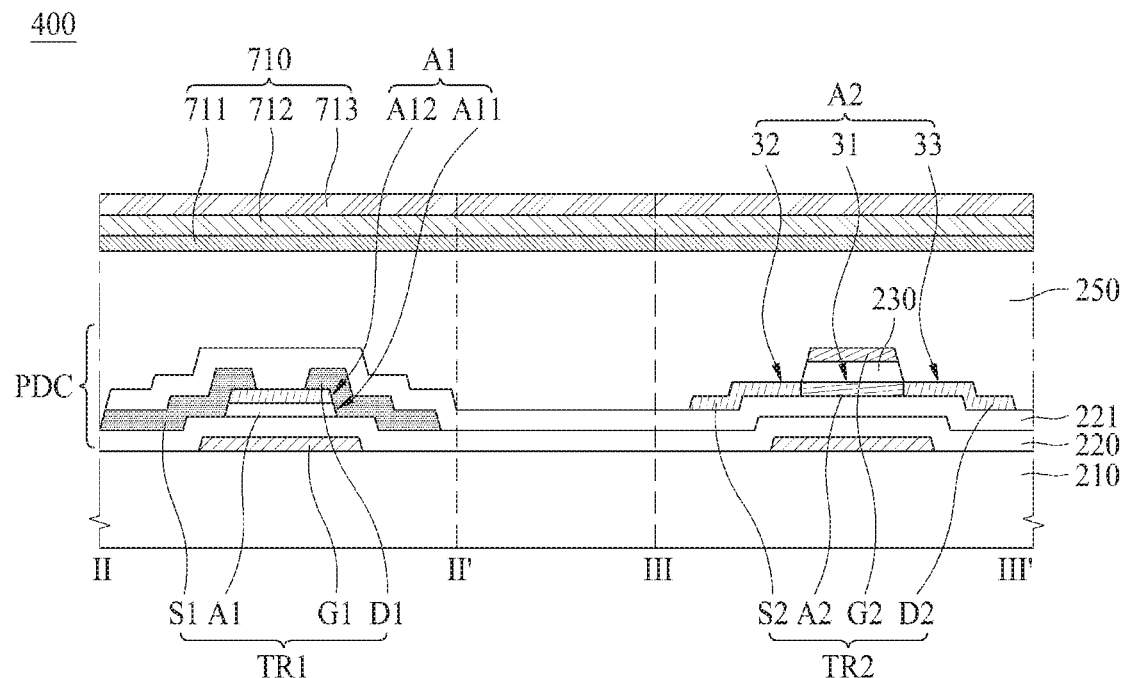
FIG. 10 is a cross sectional view illustrating thin film transistors of a display apparatus according to another embodiment of the present disclosure.

FIG. 10 is a cross sectional view illustrating thin film transistors (TR1, TR2) of a display apparatus 400 according to another embodiment of the present disclosure.

Referring to FIG. 10, a second active layer (A2) has a single-layered structure, and a second gate insulating film 230 is patterned.

The second gate insulating film 230 can be patterned together with a second gate electrode (G2). For a process of patterning the second gate electrode (G2) and the second gate insulating film 230, conducting regions 32 and 33 can be formed by a selective conductivity providing process to the second active layer (A2). Also, conducting regions of the second active layer (A2) can be formed by the patterning process for the second gate electrode (G2) and the second gate insulating film 230 or a plasma treatment after the patterning process.

In the display apparatus 400 according to another embodiment of the present disclosure, as shown in FIG. 10, the first thin film transistor (TR1) can be used as a switching transistor, and the second thin film transistor (TR2) can be used as a driving transistor.

Figure 11:
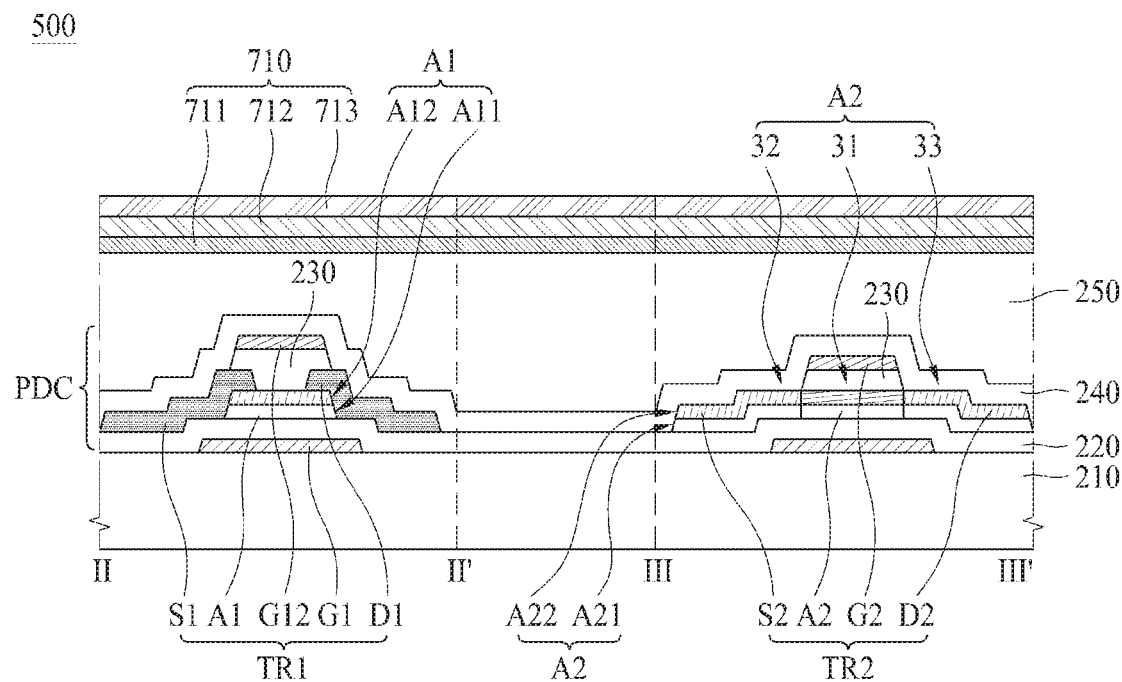
FIG. 11 is a cross sectional view illustrating thin film transistors of a display apparatus according to another embodiment of the present disclosure.

FIG. 11 is a cross sectional view illustrating thin film transistors (TR1, TR2) of a display apparatus 500 according to another embodiment of the present disclosure.

Referring to FIG. 11, the first thin film transistor (TR1) includes an upper gate electrode (G12) on a first active layer (A1). A second active layer (A2) has a dual-layered structure, and a second gate insulating film 230 is patterned. Also, a passivation layer 240 is disposed on the first thin film transistor (TR1) and the second thin film transistor (TR2). The passivation layer 240 protects the first thin film transistor (TR1) and the second thin film transistor (TR2).

In the display apparatus 500 according to another embodiment of the present disclosure, as shown in FIG. 11, the first thin film transistor (TR1) can be used as a switching transistor, and the second thin film transistor (TR2) can be used as a driving transistor.

Figure 12:
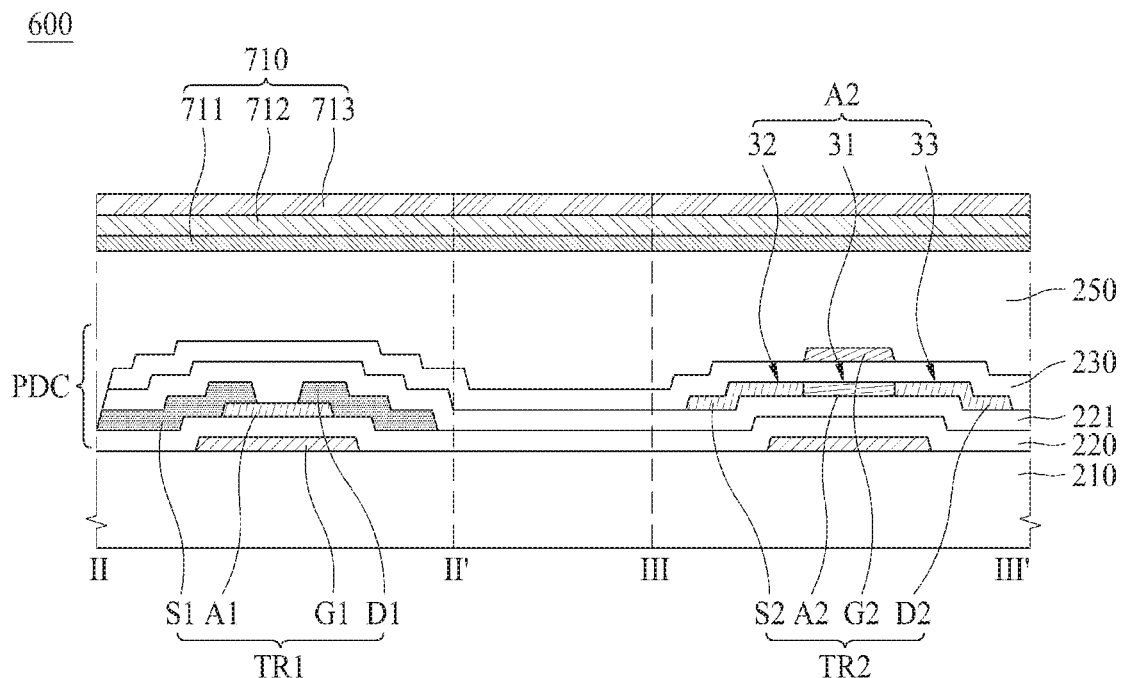
FIG. 12 is a cross sectional view illustrating thin film transistors of a display apparatus according to another embodiment of the present disclosure.

FIG. 12 is a cross sectional view illustrating thin film transistors (TR1, TR2) of a display apparatus 600 according to another embodiment of the present disclosure.

Referring to FIG. 12, a first active layer (A1) and a second active layer (A2) can have a single-layered structure, and an additional protection layer is not provided in the first active layer (A1) and the second active layer (A2). Also, an insulating interlayer 221 is disposed on a first source electrode (S1) and a first drain electrode (D1), and the second active layer (A2) is disposed on the insulating interlayer 221. As a result, the first active layer (A1) and the second active layer (A2) are disposed on the different layers from each other.

In the display apparatus 600 according to another embodiment of the present disclosure, as shown in FIG. 12, a process of forming the first source electrode (S1) and the first drain electrode (D1) is carried out after forming the first active layer (A1). An etching process is carried out for the process of forming the first source electrode (S1) and the first drain electrode (D1). If the first active layer (A1) is formed in a single-layered structure, the first active layer (A1) is exposed to the etching process for the process of forming the first source electrode (S1) and the first drain electrode (D1), whereby the first active layer (A1) can be contaminated. Accordingly, the first thin film transistor (TR1) can have a large s-factor value.

Meanwhile, the second active layer (A2) is provided after the process of forming the first source electrode (S1) and the first drain electrode (D1). Thus, the second active layer (A2) is not influenced by the etching process for the process of forming the first source electrode (S1) and the first drain electrode (D1). Also, a channel region 31 of the second active layer (A2) is protected by a second gate electrode (G2) so that a contamination of the channel region 31 of the second active layer (A2) can be less than a contamination of the first active layer (A1). As a result, an s-factor value of the second thin film transistor (TR2) can be lower than the s-factor value of the first thin film transistor (TR1).

Thus, in the display apparatus 600 according to another embodiment of the present disclosure, as shown in FIG. 12, the first thin film transistor (TR1) can be used as a driving transistor, and the second thin film transistor (TR2) can be used as a switching transistor.

Figure 13:
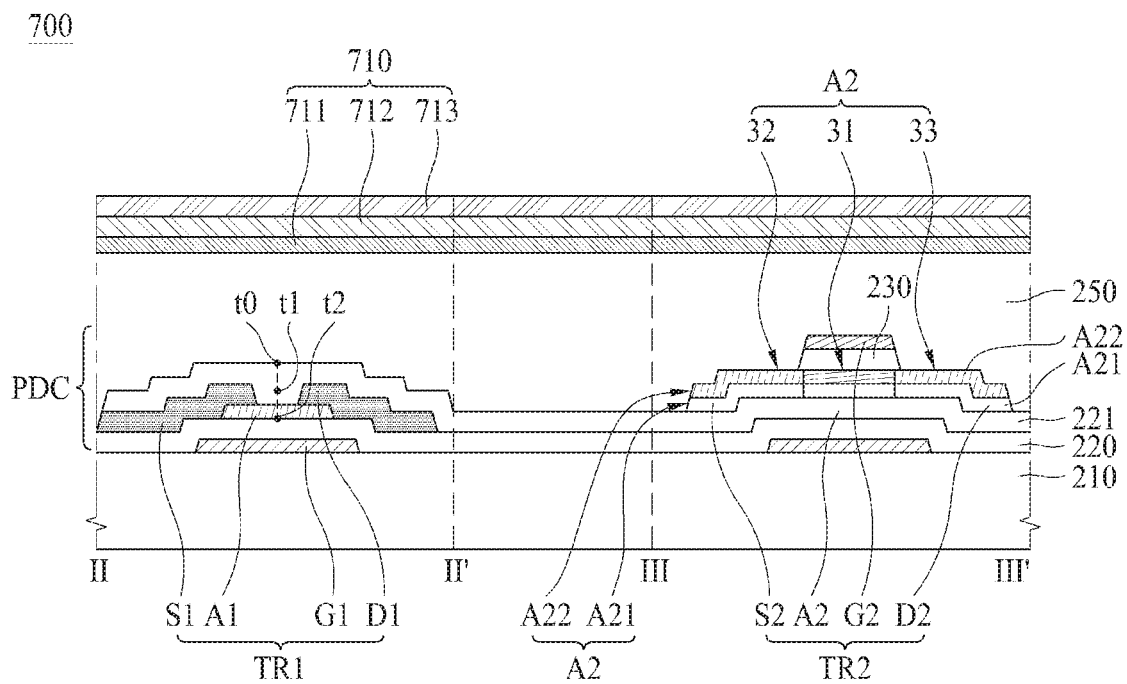
FIG. 13 is a cross sectional view illustrating thin film transistors of a display apparatus according to another embodiment of the present disclosure.

FIG. 13 is a cross sectional view illustrating thin film transistors (TR1, TR2) of a display apparatus 700 according to another embodiment of the present disclosure.

Referring to FIG. 13, in comparison to FIG. 12, a second active layer (A2) has a dual-layered structure. Thus, the second active layer (A2) can have an improved stability. As a result, an s-factor of the second thin film transistor (TR2) can be smaller than an s-factor of the first thin film transistor (TR1).

Accordingly, in case of the display apparatus 700 according to another embodiment of the present disclosure, as shown in FIG. 13, the first thin film transistor (TR1) can be used as a driving transistor, and the second thin film transistor (TR2) can be used as a switching transistor.

Figure 14:
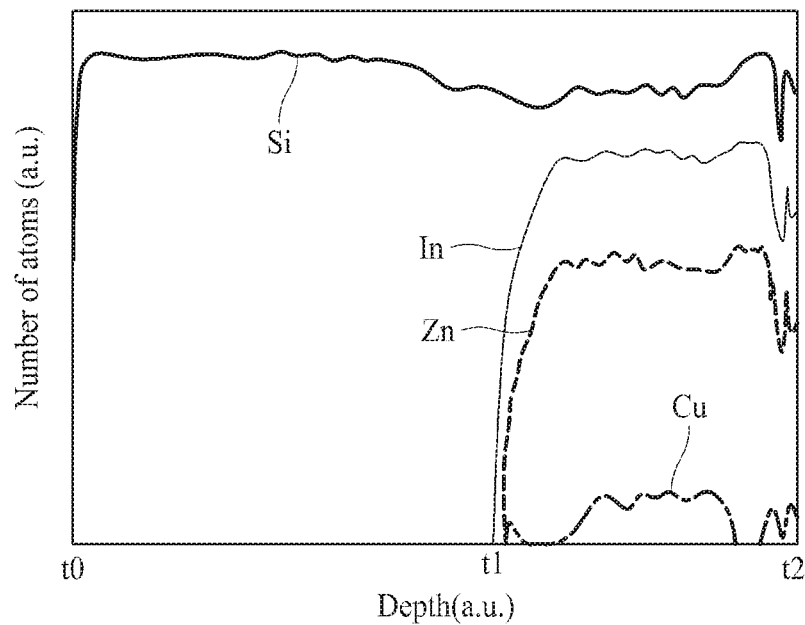
FIG. 14 is a graph for a relative ion concentration in accordance with a depth in an adjacent area of a first active layer (A1) of a first thin film transistor shown in FIG. 13.

FIG. 14 is a graph for a relative ion concentration in accordance with a depth in an adjacent area of a first active layer (A1) of the first thin film transistor shown in FIG. 13. In FIG. 14, "t0" indicates an upper point of an insulating layer 221 in FIG. 13, "t1" indicates the boundary between the insulating interlayer 221 and the first active layer (A1), and "t2" indicates a lower point of the first active layer (A1). An ion concentration is measured by "Tof-SIMS", wherein "Tof-SIMS" (Time of Flight Secondary Ion Mass Spectrometry) is a device for analyzing a composition of a material surface by making primary ion having a constant energy be incident on a solid surface of an object to be analyzed, and analyzing emitted secondary ion.

The first active layer (A1) of FIG. 13 is formed of IZTO(InZnSnO)-based oxide semiconductor material, and a first source electrode (S1) and a first drain electrode (D1) include copper (Cu).

Referring to FIG. 14, even though the oxide semiconductor material used for the first active layer (A1) does not include copper (Cu) therein, an analyzing result shows that the first active layer (A1) include a slight amount of copper (Cu). Based on the analyzing result, the copper (Cu) included in the first active layer (A1) is originated by the first source electrode (S1) and the first drain electrode (D1).

Thus, if the first active layer (A1) is formed in a single-layered structure without any layer serving as a protection film, contaminant can be introduced into the first active layer (A1), whereby an s-factor of the first thin film transistor (TR1) is increased. In this case, the first thin film transistor (TR1) can be used as a driving transistor.

Meanwhile, if the first active layer (A1) is formed in a multi-layered structure including a first oxide semiconductor layer (A11) and a second oxide semiconductor layer (A12), which serves as a protection layer for protecting a main channel layer (for example, first oxide semiconductor layer, A11), the first thin film transistor (TR1) can have a small s-factor. In this case, the first thin film transistor (TR1) can be used as a switching transistor.

Figure 15:
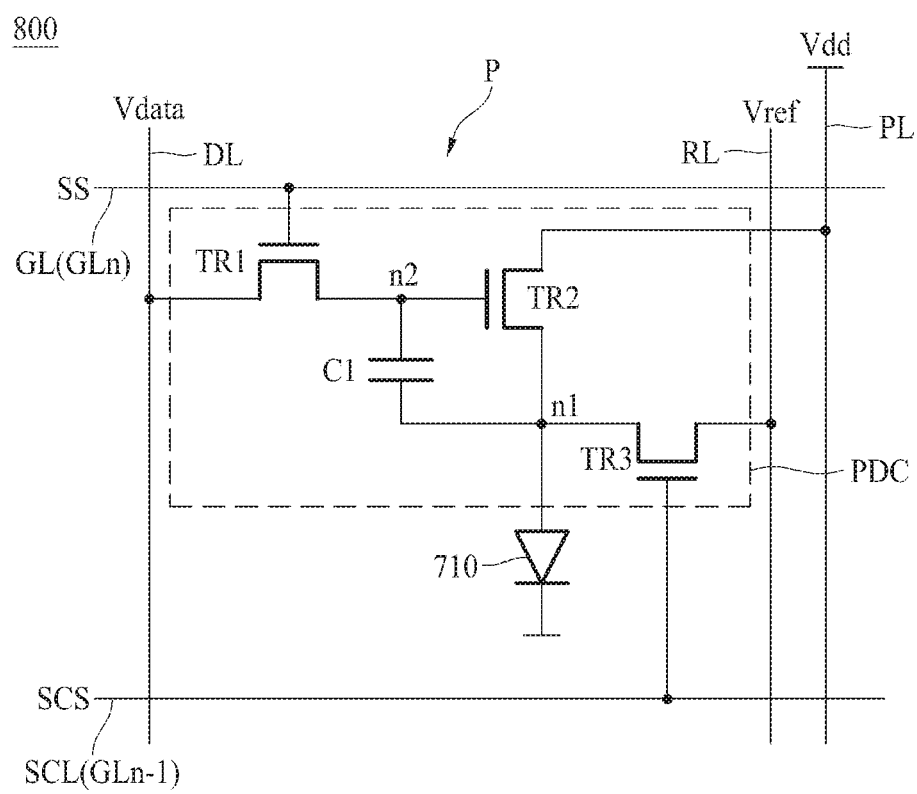
FIG. 15 is a circuit diagram for any one pixel of a display apparatus according to another embodiment of the present disclosure.

FIG. 15 is a circuit diagram for any one pixel (P) of a display apparatus 800 according to another embodiment of the present disclosure. FIG. 15 is an equivalent circuit diagram for a pixel (P) of an organic light emitting display apparatus.

The pixel (P) of the display apparatus 800 shown in FIG. 15 includes an organic light emitting diode (OLED) corresponding to a display device 710, and a pixel driving circuit (PDC) for driving the display device 710. The display device 710 is connected with the pixel driving circuit (PDC).

In the pixel (P), there are signal lines (DL, GL, PL, RL, SCL) configured to supply signals to the pixel driving circuit (PDC).

A data voltage (Vdata) is supplied to a data line (DL), a scan signal (SS) is supplied to a gate line (GL), a driving voltage (Vdd) for driving the pixel is supplied to a driving power line (PL), a reference voltage (Vref) is supplied to a reference line (RL), and a sensing control signal (SCS) is supplied to a sensing control line (SCL).

Referring to FIG. 15, when the gate line of the $(n)^{th}$ pixel (P) is referred to as "$GL_n$", the gate line of the neighboring $(n-1)^{th}$ pixel (P) is "$GL_{n-1}$", and "$GL_{n-1}$" corresponding to the gate line of the $(n-1)^{th}$ pixel (P) serves as the sensing control line (SCL) of the $(n)^{th}$ pixel (P).

For example, as shown in FIG. 15, the pixel driving circuit (PDC) includes a first thin film transistor (TR1, switching transistor) connected with the gate line (GL) and the data line (DL), a second thin film transistor (TR2, driving transistor) configured to control a level of current which is provided to the display device 710 in accordance with the data voltage (Vdata) transmitted through the first thin film transistor (TR1), and a third thin film transistor (TR3, reference transistor) configured to sense the properties of the second thin film transistor (TR2).

A first capacitor (C1) is positioned between the display device 710 and a gate electrode (G2) of the second thin film transistor (TR2). The first capacitor (C1) is referred to as a storage capacitor (Cst).

According as the first thin film transistor (TR1) is turned-on by the scan signal (SS) supplied to the gate line (GL), the first thin film transistor (TR1) transmits the data voltage (Vdata), which is supplied to the data line (DL), to the gate electrode (G2) of the second thin film transistor (TR2).

The third thin film transistor (TR3) is connected with the reference line (RL) and a first node (n1) provided between the display device 710 and the second thin film transistor (TR2). The third thin film transistor (TR3) is turned-on or turned-off by the sensing control signal (SCS), and the third thin film transistor (TR3) senses the properties of the second thin film transistor (TR2) corresponding the driving transistor for a sensing period.

A second node (n2) connected with the gate electrode (G2) of the second thin film transistor (TR2) is connected with the first thin film transistor (TR1). The first capacitor (C1) is formed between the second node (n2) and the first node (n1).

When the first thin film transistor (TR1) is turned-on, the data voltage (Vdata) supplied through the data line (DL) is supplied to the gate electrode (G2) of the second thin film transistor (TR2). The first capacitor (C1) formed between a source electrode (S2) and the gate electrode (G2) of the second thin film transistor (TR2) is charged with the data voltage (Vdata).

When the second thin film transistor (TR2) is turned-on, a current is supplied to the display device 710 through the second thin film transistor (TR2) by the driving voltage (Vdd) for driving the pixel, whereby light is emitted from the display device 710.

Figure 16:
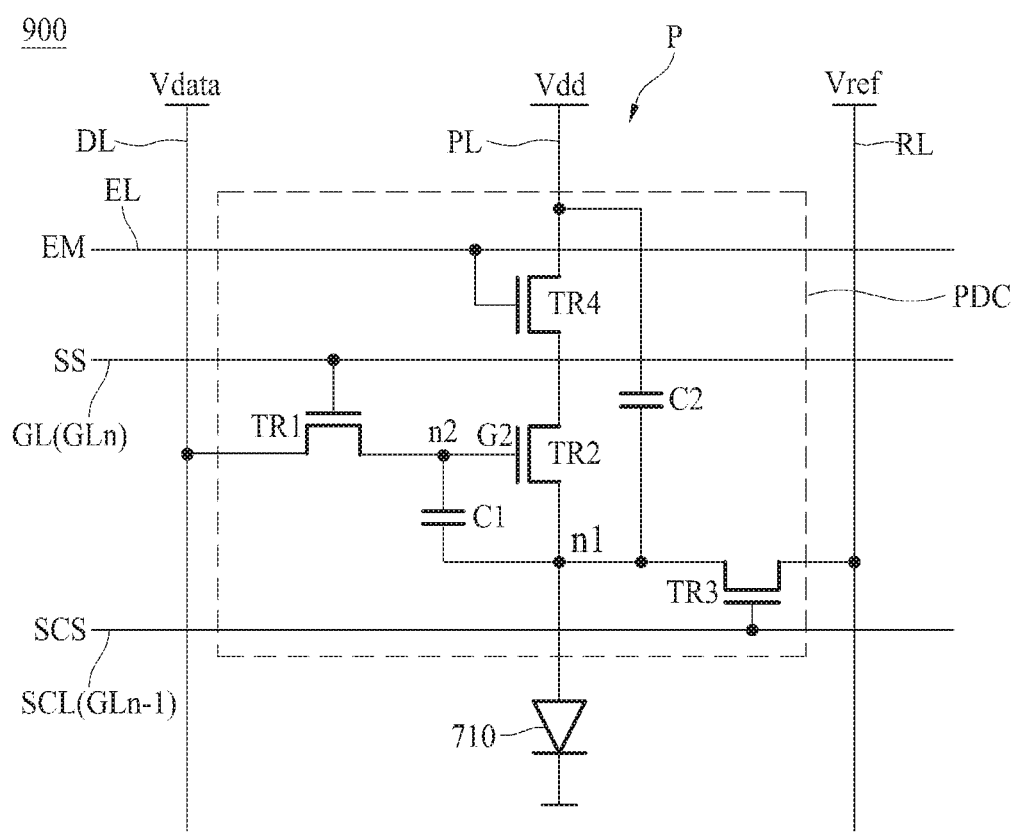
FIG. 16 is a circuit diagram for any one pixel of a display apparatus according to another embodiment of the present disclosure.

FIG. 16 is a circuit diagram illustrating any one pixel (P) of a display apparatus 900 according to another embodiment of the present disclosure.

The pixel (P) of the display apparatus 900 shown in FIG. 16 includes an organic light emitting diode (OLED) corresponding to a display device 710, and a pixel driving circuit (PDC) configured to drive the display device 710. The display device 710 is connected with the pixel driving circuit (PDC).

The pixel driving circuit (PDC) includes thin film transistors (TR1, TR2, TR3, TR4).

In the pixel (P), there are signal lines (DL, EL, GL, PL, SCL, RL) configured to supply driving signals to the pixel driving circuit (PDC).

In comparison to the pixel (P) of FIG. 15, the pixel (P) of FIG. 16 further includes an emission control line (EL). An emission control signal (EM) is supplied to the emission control line (EL).

Also, in comparison to the pixel driving circuit (PDC) of FIG. 15, the pixel driving circuit (PDC) of FIG. 16 further includes a fourth thin film transistor (TR4) corresponding to an emission control transistor configured to control a light emission time point of the second thin film transistor (TR2).

Referring to FIG. 16, when the gate line of the $(n)^{th}$ pixel (P) is referred to as "$GL_n$", the gate line of the neighboring $(n-1)^{th}$ pixel (P) is "$GL_{n-1}$", and "$GL_{n-1}$" corresponding to the gate line of the $(n-1)^{th}$ pixel (P) serves as the sensing control line (SCL) of the $(n)^{th}$ pixel (P).

A first capacitor (C1) is positioned between the display device 710 and a gate electrode (G2) of the second thin film transistor (TR2). Also, a second capacitor (C2) is positioned between one electrode of the display device 710 and a terminal supplied with a driving voltage (Vdd) among terminals of the fourth thin film transistor (TR4).

According as the first thin film transistor (TR1) is turned-on by the scan signal (SS) supplied to the gate line (GL), the first thin film transistor (TR1) transmits the data voltage (Vdata), which is supplied to the data line (DL), to the gate electrode (G2) of the second thin film transistor (TR2).

The third thin film transistor (TR3) is connected with a reference line (RL). The third thin film transistor (TR3) is turned-on or turned-off by the sensing control signal (SCS), and the third thin film transistor (TR3) senses the properties of the second thin film transistor (TR2) corresponding the driving transistor for a sensing period.

The fourth thin film transistor (TR4) transmits the driving voltage (Vdd) to the second thin film transistor (TR2), or blocks the driving voltage (Vdd) in accordance with the emission control signal (EM). When the fourth thin film transistor (TR4) is turned-on, a current is supplied to the second thin film transistor (TR2), whereby light is emitted from the display device 710.

The pixel driving circuit (PDC) according to another embodiment of the present disclosure can be formed in various structures in addition to the above-described structure. For example, the pixel driving circuit (PDC) can include five thin film transistors or more.

Hereinafter, a method for manufacturing the display apparatus 100 according to one embodiment of the present disclosure will be described with reference to FIGS. 17A to 17L.

FIGS. 17A to 17L are cross sectional views illustrating a method for manufacturing the display apparatus 100 according to one embodiment of the present disclosure.

Figure 17A:
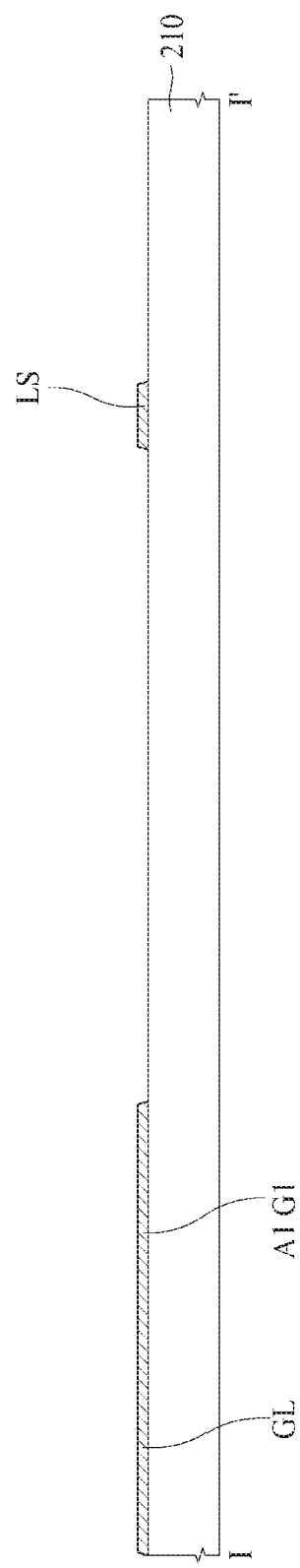
FIGS. 17A to 17L are cross sectional views illustrating a method for manufacturing the display apparatus according to one embodiment of the present disclosure.

Referring to FIG. 17A, the gate line (GL), the first gate electrode (G1), and the light shielding layer (LS) are provided on the substrate 210. The first gate electrode (G1) is formed as one body with the gate line (GL).

Figure 17B:
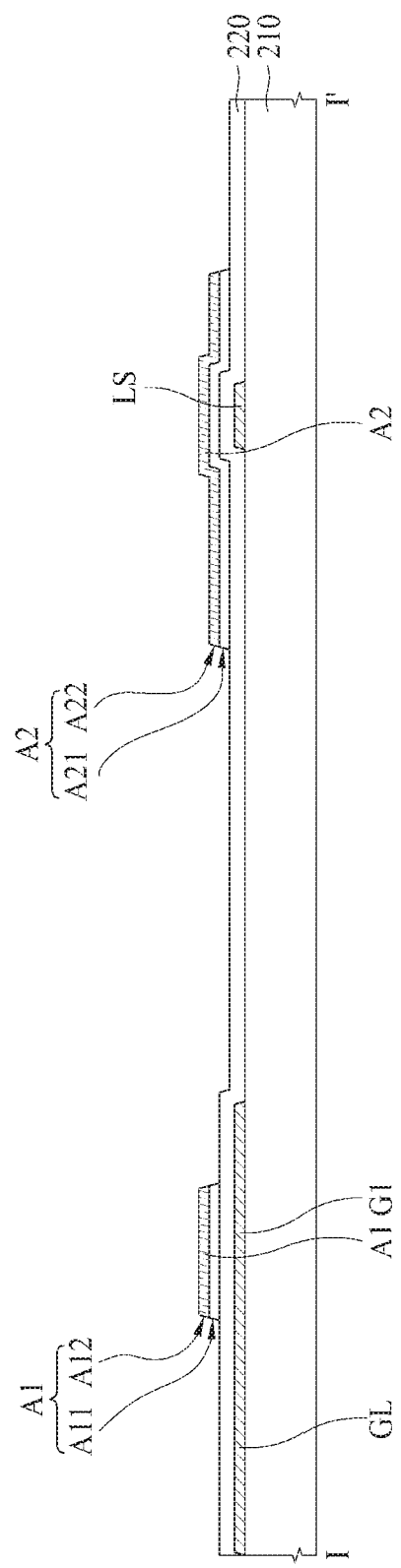

Referring to FIG. 17B, the first gate insulating film 220 is provided on the gate line (GL), the first gate electrode (G1), and the light shielding layer (LS). The first active layer (A1) and the second active layer (A2) are provided on the first gate insulating film 220. The first active layer (A1) is overlapped with the first gate electrode (G1).

The first active layer (A1) and the second active layer (A2) can be formed by the use of oxide semiconductor material. For example, the first active layer (A1) and the second active layer (A2) include the first oxide semiconductor layer (A11, A21), and the second oxide semiconductor layer (A12, A22) on the first oxide semiconductor layer (A11, A21).

Figure 17C:
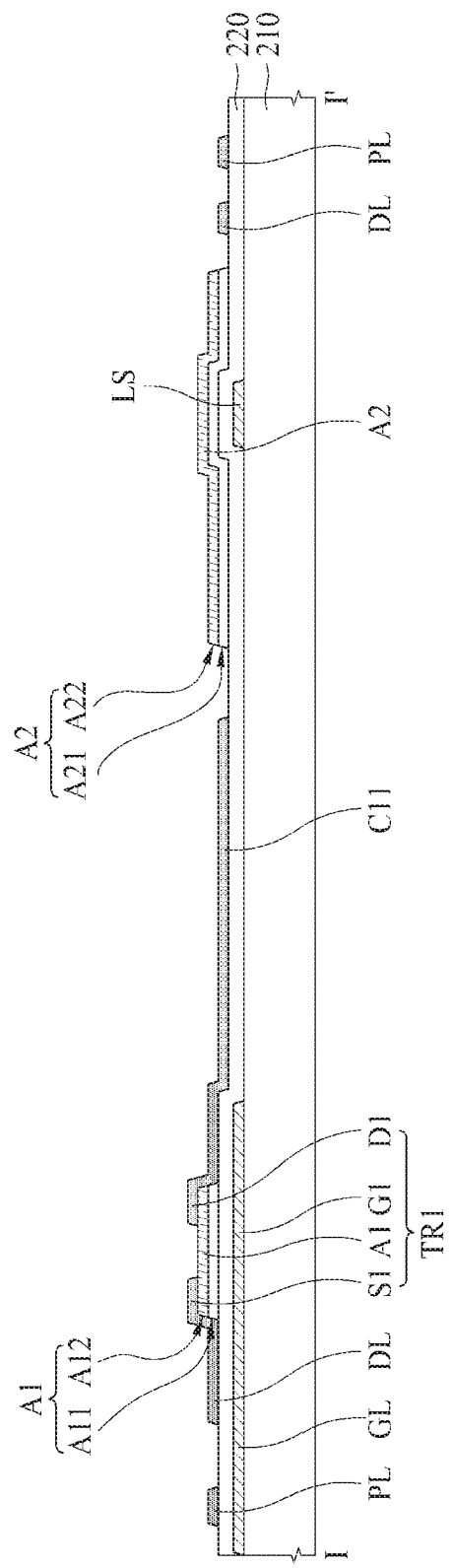
Figure 17D:
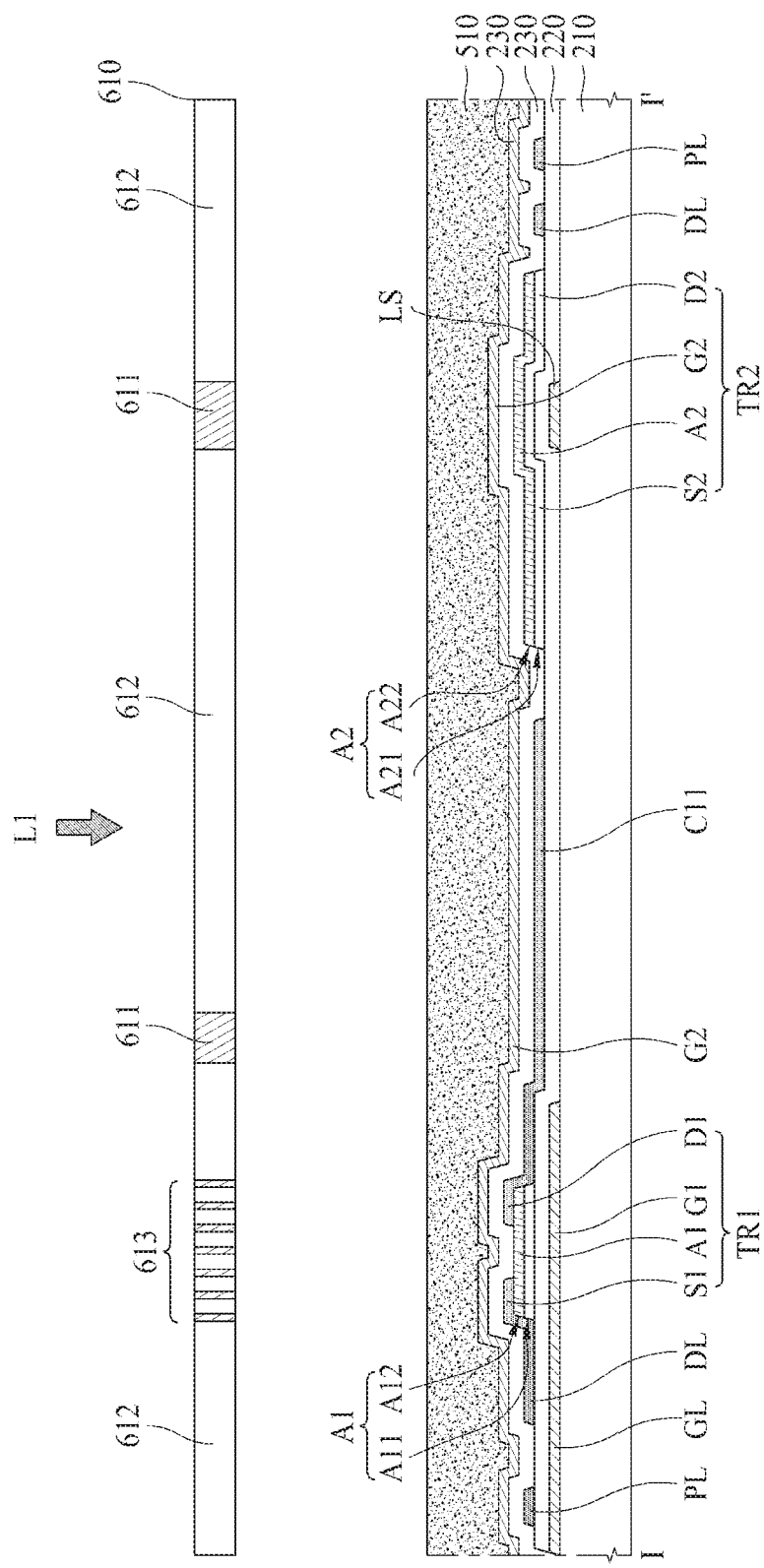

Referring to FIG. 17C, the first source electrode (S1) and the first drain electrode (D1) are spaced apart from each other, and are respectively connected with the first active layer (A1). Also, the data line (DL) and the driving power line (PL) are provided on the first gate insulating film 220 while being manufactured together with the first source electrode (S1) and the first drain electrode (D1).

Then, referring to FIGS. 17D to 17H, the second gate insulating film 230 is provided on the first source electrode (S1), the first drain electrode (D1), the first capacitor electrode (C11), the data line (DL), and the driving power line (PL). The second gate electrode (G2) is provided on the second gate insulating film 230, and at least a region of the second active layer (A2) is provided with conductivity.

In detail, referring to FIG. 17, the second gate insulating film 230 is provided on the first source electrode (S1), the first drain electrode (D1), the first capacitor electrode (C11), the data line (DL), and the driving power line (PL), and a conductive material layer 310 is provided on the second gate insulating film 230.

The conductive material layer 310 can be formed of a material for forming the second gate electrode (G2). For example, the conductive material layer 310 can include at least one among aluminum-based metal such as aluminum or aluminum alloy, argentums-based metal such as argentums (Ag) or argentums alloy, copper-based metal such as copper (Cu) or copper alloy, molybdenum-based metal such as molybdenum or molybdenum alloy, chrome (Cr), tantalum (Ta), neodymium (Nd), and titanium (Ti). The conductive material layer 310 can have a multi-layered structure including at least two layers with the different physical properties.

Also a photoresist layer 510 is disposed on the conductive material layer 310, and a halftone mask 610 is disposed above the photoresist layer 510. The halftone mask 610 includes a light blocking portion 611, a transmitting portion 612, and a semi-transmitting portion 613.

The halftone mask 610 is disposed while being spaced apart from the photoresist layer 510, and light (L1) is irradiated thereunto through the halftone mask 610, whereby a selective exposure for the photoresist layer 510 is performed.

Figure 17E:
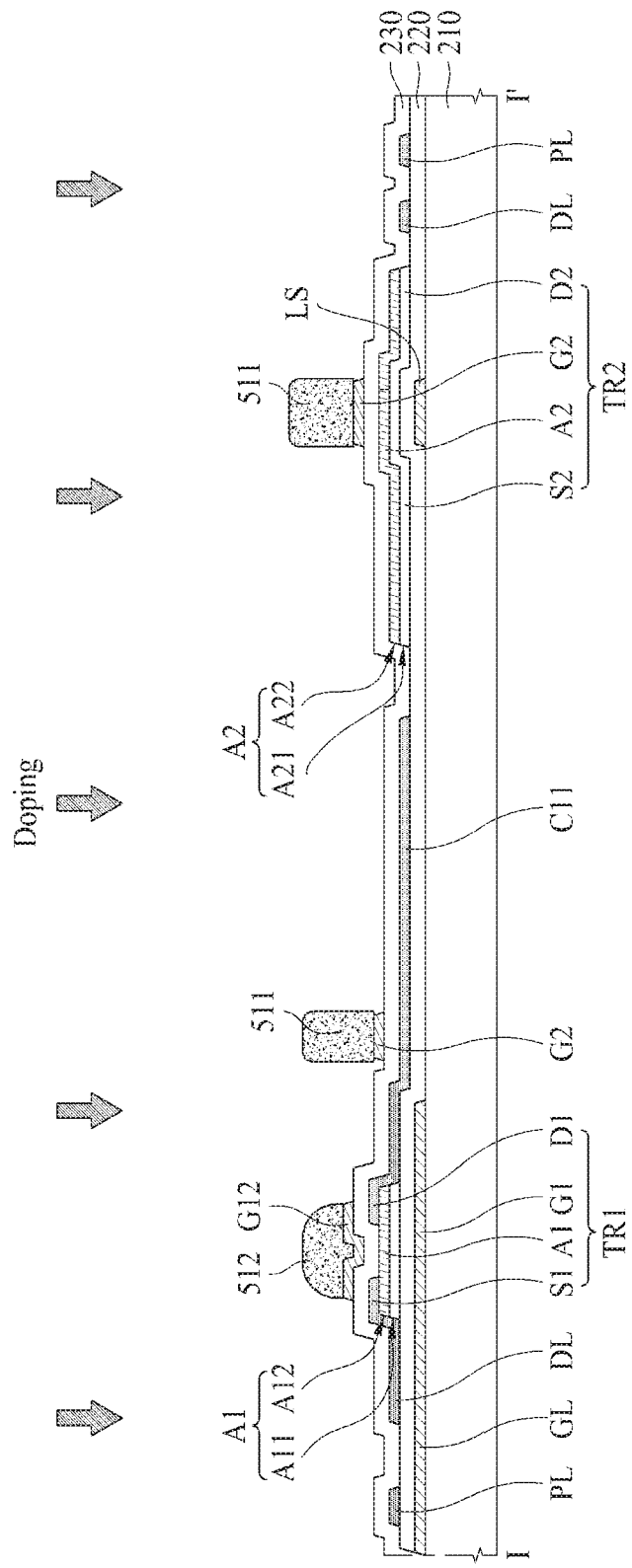

Referring to FIG. 17E, the selectively-exposed photoresist layer 510 is developed, to thereby form a plurality of photoresist patterns 511 and 512. Also, the conductive material layer 310 is patterned by an etching process using the photoresist pattern 511 and 512 as a mask, to thereby form the second gate electrode (G2) and the upper gate electrode (G12).

At least a portion of the second gate electrode (G2) can overlap with the second active layer (A2).

The upper gate electrode (G12) is overlapped with the first active layer (A1). The upper gate electrode (G12) can cover the channel region of the first active layer (A1), which is exposed from the first source electrode (S1) and the first drain electrode (D1), to thereby protect the channel region of the first active layer (A1).

Also referring to FIG. 17E, the selective conductivity providing process to the second active layer (A1) is carried out under the condition that the second gate electrode (G2), the upper gate electrode (G12), and the photoresist patterns 511 and 512 are used as a mask. The first active layer (A1) is protected by the upper gate electrode (G12) and the photoresist pattern 512, whereby the conductivity providing process to the first active layer (A1) is not performed.

The selective conductivity providing process to the second active layer (A2) can include the doping process using dopant.

For example, a region of the second active layer (A2) can be provided with conductivity, selectively, by the doping process using dopant, and thus becomes a conducting region. In this case, doped regions are provided with conductivity and thus become the conducting regions 32 and 33. For the doping process, for example, at least one of boron (B) ion, phosphorous (P) ion, and fluorine (F) ion can be used. However, one embodiment of the present disclosure is not limited to the above. The selective conductivity providing process to the second active layer (A2) can be carried out by a dry etching process, a plasma treatment, or a photo irradiation process.

Figure 17F:
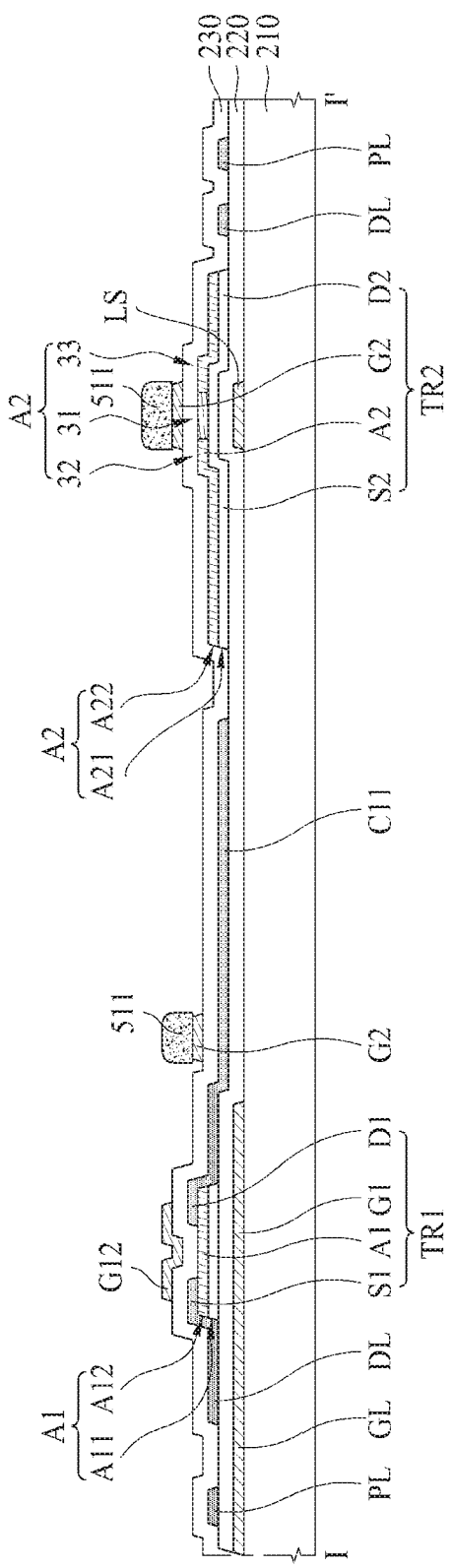

Referring to FIG. 17F, according as the photoresist patterns 511 and 512 are ashed, the photoresist pattern 511 remains only on the second gate electrode (G2), whereby the photoresist pattern 512 is completely removed from the area on the upper gate electrode (G12). As a result, the upper gate electrode (G12) is exposed to the external.

Figure 17G:
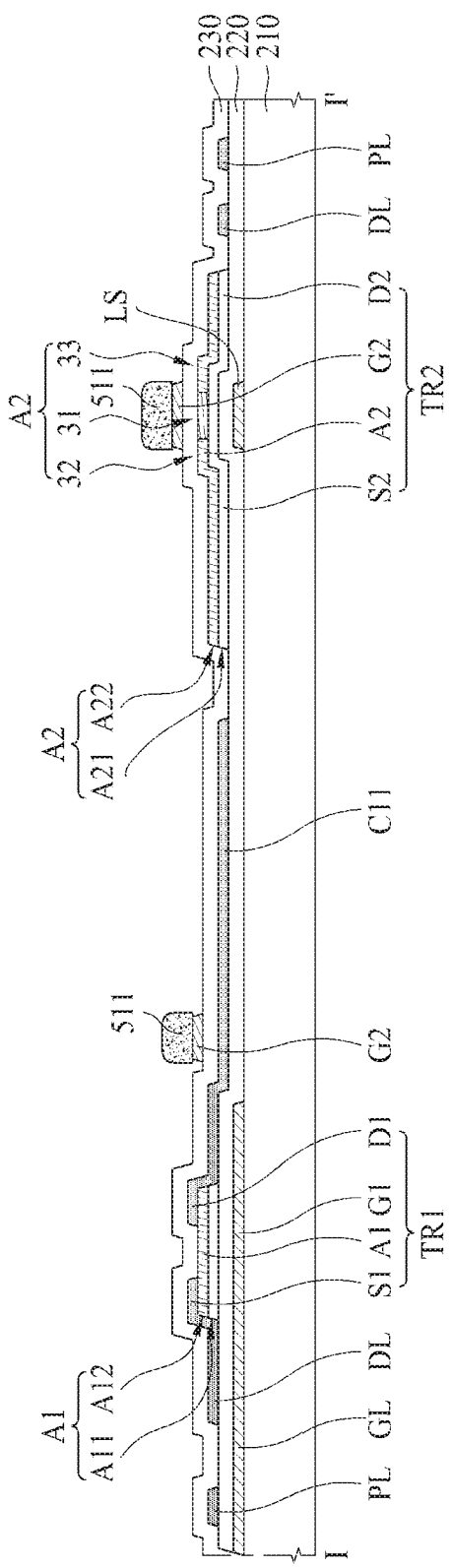

Referring to FIG. 17G, the upper gate electrode (G12) is removed by an additional etching process.

Figure 17H:
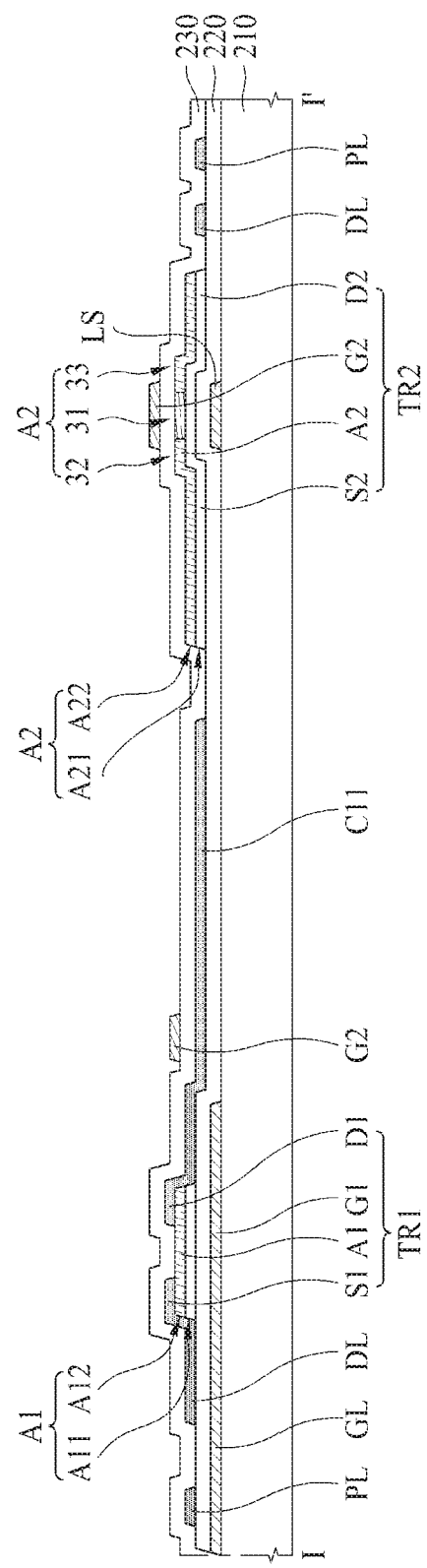

Referring to FIG. 17H, the photoresist pattern 511 is removed from the area on the second gate electrode (G2) by an additional ashing process.

Figure 17I:
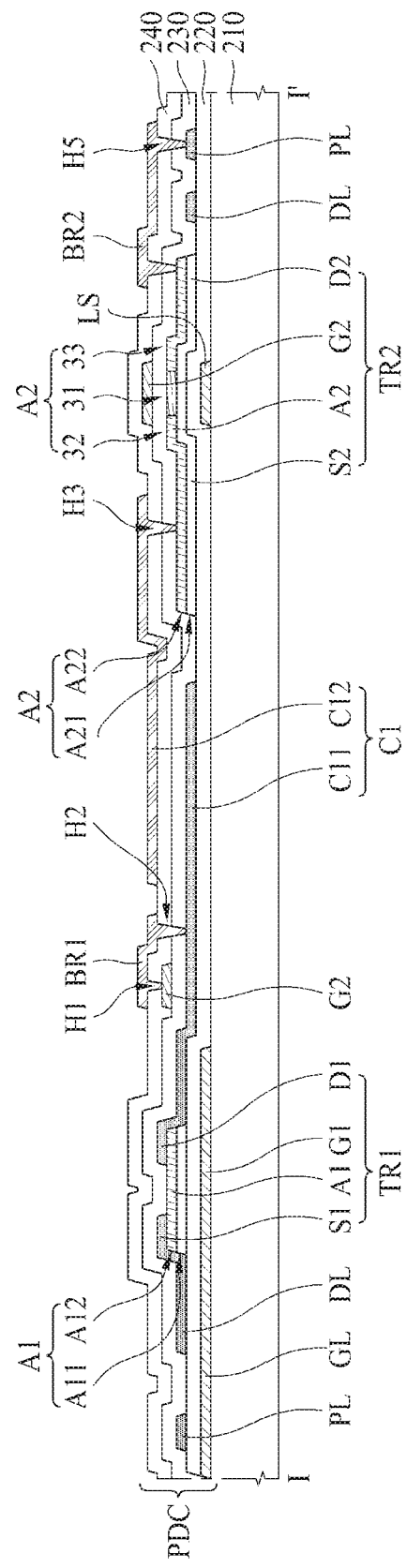

Referring to FIG. 17I, the passivation layer 240 is provided on the second gate electrode (G2), and the first connection electrode (BR1), the second connection electrode (BR2), and the second capacitor electrode (C12) are provided on the passivation layer 240.

The first connection electrode (BR1) is provided to connect the first drain electrode (D1) and the second gate electrode (G2) with each other. For the connection between the first drain electrode (D1) and the second gate electrode (G2), the first contact hole (H1) is formed in the passivation layer 240, and the second contact hole (H2) is formed in the passivation layer 240 and the second gate insulating film 230. The first connection electrode (BR1) is in contact with the first drain electrode (DL) via the first contact hole (H1), and the first connection electrode (BR1) is in contact with the second gate electrode (G2) via the second contact hole (H2).

The second connection electrode (BR2) is provided to connect the driving power line (PL) and the second active layer (A2) with each other. For the connection between the driving power line (PL) and the second active layer (A2), the fourth contact hole (H4) and the fifth contact hole (H5) are provided. The second connection electrode (BR2) is in contact with the drain region 33 of the second active layer (A2) via the fourth contact hole (H4), and the second connection electrode (BR2) is in contact with the driving power line (PL) via the fifth contact hole (H5).

The second capacitor electrode (C12) is in contact with the source region 32 of the second active layer (A2) via the third contact hole (H3). At least a portion of the second capacitor electrode (C12) can overlap with the first capacitor electrode (C11).

Figure 17J:
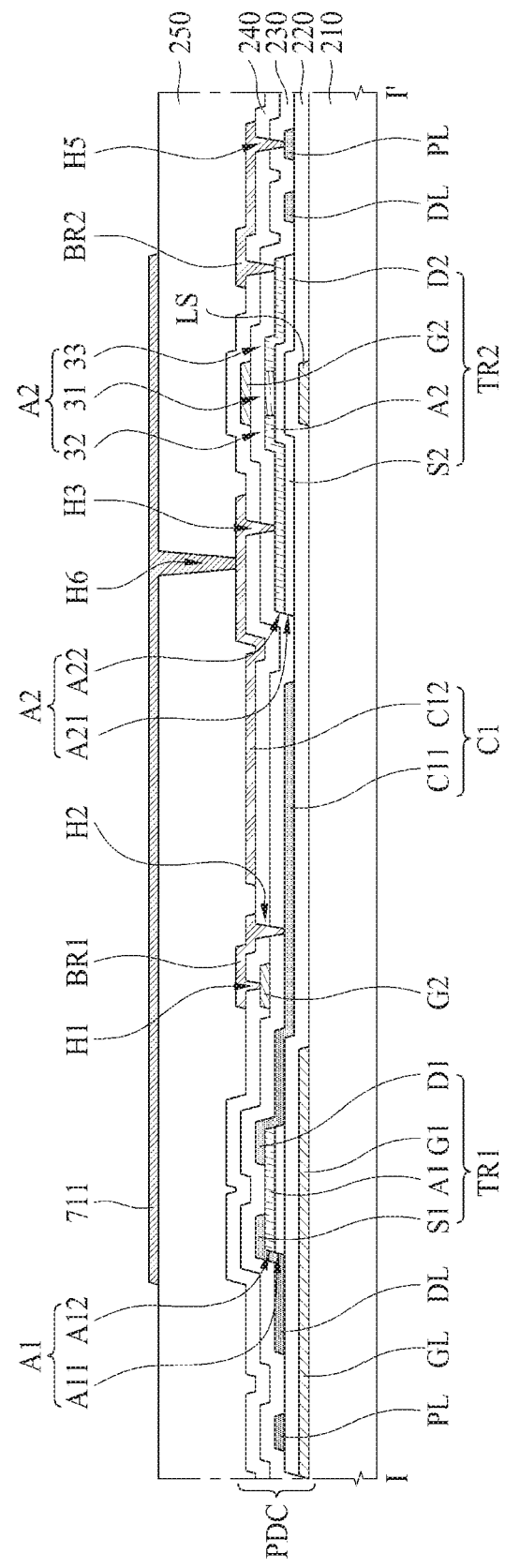

Referring to FIG. 17J, the protection layer 250 is provided on the first connection electrode (BR1), the second connection electrode (BR2), and the second capacitor electrode (C12). The first electrode 711 of the display device 710 is provided on the protection layer 250. According as the first electrode 711 of the display device 710 is connected with the second capacitor electrode (C12) via the sixth contact hole (H6), the first electrode 711 of the display device 710 can be connected with the source electrode (S2) of the second thin film transistor (TR2).

Figure 17K:
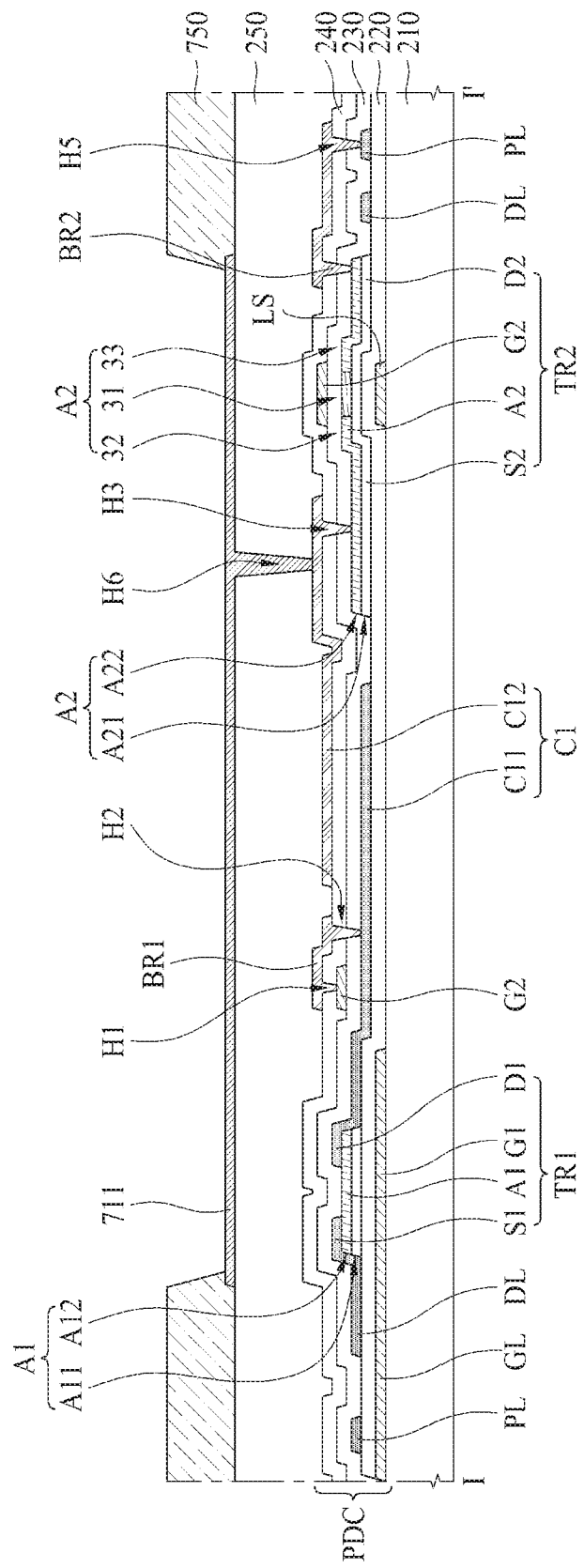

Referring to FIG. 17K, the bank layer 750 is disposed on the periphery of the first electrode 711. The bank layer 750 defines the emission area of the display device 710.

Figure 17L:
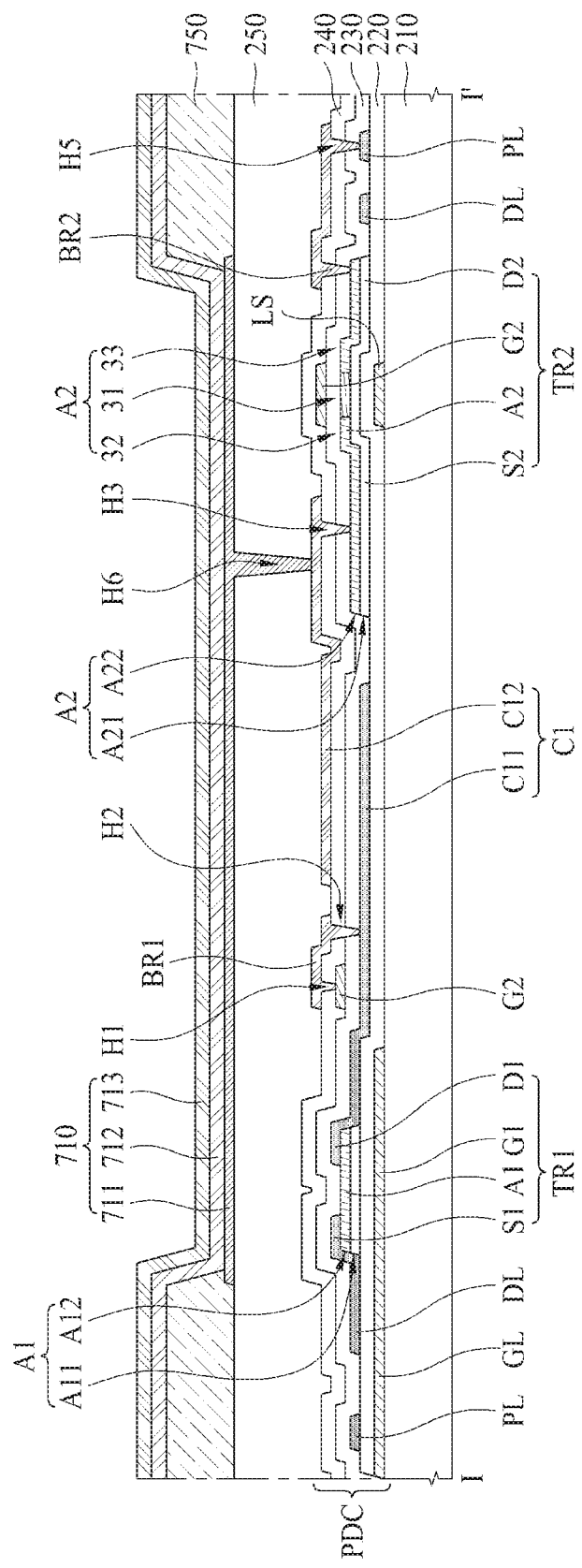

Referring to FIG. 17L, the emission layer 712 is disposed on the first electrode 711, and the second electrode 713 is disposed on the emission layer 712. Herein, the emission layer 712 is the organic emission layer including the organic material. Accordingly, it is possible to complete the display device 710.

According to one embodiment of the present disclosure, it is possible to improve efficiency of the display apparatus by the bottom gate type thin film transistor and the top gate type thin film transistor having the different properties from each other.

In detail, the display apparatus according to one embodiment of the present disclosure includes the bottom gate type thin film transistor and the top gate type thin film transistor, which have the different properties from each other, wherein any one of the bottom gate type thin film transistor and the top gate type thin film transistor is used as the switching transistor, and the other is used as the driving transistor.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A display apparatus comprising:
   a pixel driving circuit on a substrate; and
   a display device connected with the pixel driving circuit,
   wherein the pixel driving circuit includes a first thin film transistor and a second thin film transistor, and a capacitor including a first capacitor electrode and a second capacitor electrode,
   wherein the first thin film transistor includes:
      a first gate electrode on the substrate; and
      a first active layer which is spaced apart from the first gate electrode and overlaps with at least a portion of the first gate electrode,
   wherein the second thin film transistor includes:
      a second active layer on the substrate; and
      a second gate electrode which is spaced apart from the second active layer and overlaps with at least a portion of the second active layer,
   wherein each of the first active layer and the second active layer includes an oxide semiconductor material,
   wherein an s-factor value of the first thin film transistor is smaller than an s-factor value of the second thin film transistor,
   wherein the first thin film transistor further includes an upper gate electrode on the first active layer, the first active layer is disposed between the upper gate electrode and the first gate electrode,
   wherein the capacitor is disposed under the display device in a location between the first thin film transistor and second thin film transistor, and
   wherein the first capacitor electrode is disposed on a same layer as the first active layer and disposed on a same layer as the second active layer.

2. The display apparatus according to claim 1, wherein the first active layer includes:
   a first oxide semiconductor layer; and
   a second oxide semiconductor layer on the first oxide semiconductor layer.

3. The display apparatus according to claim 1,
   wherein the first gate electrode is disposed between the substrate and the first active layer, and
   the second active layer is disposed between the substrate and the second gate electrode.

4. The display apparatus according to claim 1, wherein the first active layer and the second active layer are disposed on a same layer.

5. The display apparatus according to claim 1, wherein the first active layer and the second active layer are disposed on different layers from each other.

6. The display apparatus according to claim 1, wherein the first thin film transistor is a switching transistor, and the second thin film transistor is a driving transistor.

7. The display apparatus according to claim 1, wherein the first thin film transistor is a driving transistor, and the second thin film transistor is a switching transistor.

8. The display apparatus according to claim 1, wherein a width of the upper gate electrode of the first thin film transistor is approximately equal to a width of the first active layer of the first thin film transistor.

9. The display apparatus according to claim 1, wherein the display device is an organic light emitting diode, and
   wherein both of the first and second thin film transistors are disposed under and fully overlapped by the organic light emitting diode.

10. The display apparatus according to claim 1, wherein the first capacitor electrode is disposed on a same layer and formed of a same material as a first drain electrode of the first thin film transistor.

11. The display apparatus according to claim 1, wherein the display device is an organic light emitting diode, and
   wherein the first and second thin film transistors and the first and second capacitor electrodes are disposed under and fully overlapped by the organic light emitting diode.

12. The display apparatus according to claim 1, wherein a source electrode of the first thin film transistor and a drain electrode of the first film transistor are made of a metal material, and
   wherein a source electrode of the second thin film transistor and a drain electrode of the second film transistor are made of a same material as the oxide semiconductor material of the second active layer and a conductive dopant.

13. A display apparatus comprising:
   a pixel driving circuit on a substrate; and
   a display device connected with the pixel driving circuit, wherein the pixel driving circuit includes a first thin film transistor and a second thin film transistor, and a capacitor including a first capacitor electrode and a second capacitor electrode, wherein the first thin film transistor includes a first gate electrode on the substrate, and a first active layer on the first gate electrode, wherein the second thin film transistor includes a second active layer on the substrate, and a second gate electrode on the second active layer, wherein each of the first active layer and the second active layer includes an oxide semiconductor material, wherein an s-factor value of the first thin film transistor is larger than an s-factor value of the second thin film transistor, wherein the first thin film transistor further includes an upper gate electrode on the first active layer, the first active layer is disposed between the upper gate electrode and the first gate electrode, wherein the capacitor is disposed under the display device in a location between the first thin film transistor and second thin film transistor, and wherein the first capacitor electrode is disposed on a same layer as the first active layer and disposed on a same layer as the second active layer.

14. The display apparatus according to claim 13, wherein the second active layer includes:

a first oxide semiconductor layer; and a second oxide semiconductor layer on the first oxide semiconductor layer.

15. The display apparatus according to claim 13, wherein the first active layer and the second active layer are disposed on different layers from each other.

16. A method for manufacturing a display apparatus, the method comprising:

providing a first gate electrode on a substrate;

providing a first active layer which is spaced apart from the first gate electrode and overlaps with at least a portion of the first gate electrode;

providing a second active layer which is spaced apart from the first active layer on the substrate;

providing a first source electrode and a first drain electrode which are spaced apart from each other and are respectively connected with the first active layer;

providing a first capacitor electrode of a capacitor, the first capacitor electrode being connected to any one of the first source electrode and the first drain electrode;

providing a second gate electrode which is spaced apart from the second active layer and overlaps with at least a portion of the second active layer;

providing an upper gate electrode on the first active layer; and selectively providing conductivity to the second active layer; wherein the first active layer and the second active layer are formed of an oxide semiconductor material, wherein the first active layer is disposed between the upper gate electrode and the first gate electrode.

17. The method according to claim 16, wherein at least one of the first active layer and the second active layer includes:

a first oxide semiconductor layer; and a second oxide semiconductor layer on the first oxide semiconductor layer.

18. The method according to claim 16, wherein providing the first active layer and providing the second active layer are carried out at the same time.

19. The method according to claim 18, wherein providing the first active layer and providing the second active layer include a patterning process using a halftone mask.

20. The method according to claim 16, further comprising:

providing a first connection electrode and a second connection electrode on the substrate.

\* \* \* \* \*